US010901557B2

(12) United States Patent
Ali et al.

(10) Patent No.: US 10,901,557 B2
(45) Date of Patent: Jan. 26, 2021

(54) PCAP WITH ENHANCED IMMUNITY TO WATER CONTAMINANTS

(71) Applicant: Elo Touch Solutions, Inc., Milpitas, CA (US)

(72) Inventors: Gazi Ali, Sunnyvale, CA (US); Yansun Xu, Mountain View, CA (US)

(73) Assignee: Elo Touch Solutions, Inc., Milpitas, CA (US)

( * ) Notice: Subject to any disclaimer, the term of this patent is extended or adjusted under 35 U.S.C. 154(b) by 97 days.

(21) Appl. No.: 15/982,124

(22) Filed: May 17, 2018

(65) Prior Publication Data
US 2018/0335870 A1 Nov. 22, 2018

Related U.S. Application Data

(60) Provisional application No. 62/508,549, filed on May 19, 2017.

(51) Int. Cl.
*G06F 3/044* (2006.01)
*H05K 5/00* (2006.01)
(Continued)

(52) U.S. Cl.
CPC ............ *G06F 3/044* (2013.01); *G06F 3/0418* (2013.01); *G06F 3/041662* (2019.05); *H05K 5/0017* (2013.01); *H05K 5/065* (2013.01)

(58) Field of Classification Search
None
See application file for complete search history.

(56) References Cited

U.S. PATENT DOCUMENTS 9,740,352 B2    8/2017  Ahsan et al.
2012/0327004 A1* 12/2012 Mikladal ................. G06F 3/044
                                                   345/173
(Continued)

FOREIGN PATENT DOCUMENTS

WO    WO 2014/046711 A1    3/2014

OTHER PUBLICATIONS

Notification of Transmittal of the International Search Report and the Written Opinion of the International Searching Authority, or the Declaration, dated Aug. 10, 2018, for PCT Appl. No. PCT/US2018/033341, 14 pages.

*Primary Examiner* — Stephen G Sherman
*Assistant Examiner* — Donna V Lui
(74) *Attorney, Agent, or Firm* — Sterne, Kessler, Goldstein & Fox P.L.L.C.

(57) ABSTRACT

System, method, and computer program product embodiments are provided that can support touch interaction on a projective capacitive (PCAP) display system in the presence of water contamination. According to an embodiment, a system includes a touchscreen coupled to a controller. The controller determines the presence of water contamination on the touchscreen, and obtains measurements during a mixed-mode measurement frame that includes a self-mode measurement and a mutual-mode measurement. Based on the measurements obtained, the controller determines a touch on the touchscreen in the presence of the water contamination on the touchscreen. In some embodiments, the self-mode measurement includes measurements collected at a both lower and a higher drive frequency, the higher drive frequency may be in the frequency range of 100 kHz to 500 kHz. In another embodiment, the self-mode measurement includes simultaneously measuring both horizontal-electrodes and vertical-electrodes.

20 Claims, 19 Drawing Sheets

(51) Int. Cl.
*H05K 5/06* (2006.01)
*G06F 3/041* (2006.01)

(56) References Cited

U.S. PATENT DOCUMENTS

| | | |
|---|---|---|
| 2013/0257767 A1 | 10/2013 | Wu et al. |
| 2016/0259448 A1* | 9/2016 | Guarneri ............... G06F 3/0416 |
| 2017/0131829 A1 | 5/2017 | Takahashi et al. |
| 2017/0242534 A1* | 8/2017 | Gray ....................... G06F 3/044 |
| 2018/0024665 A1 | 1/2018 | Kent et al. |
| 2018/0275824 A1* | 9/2018 | Li ........................... G06F 3/044 |

* cited by examiner

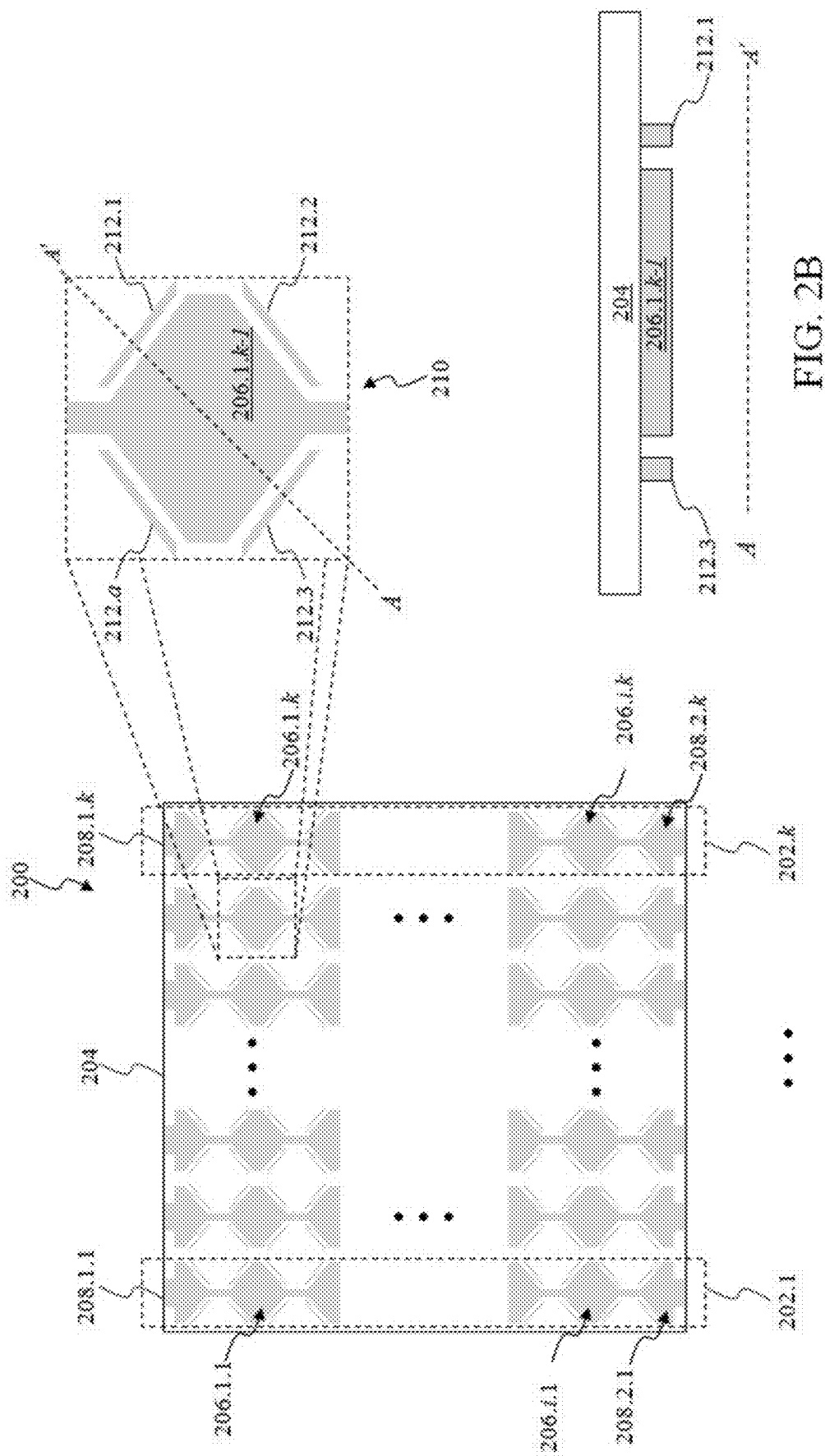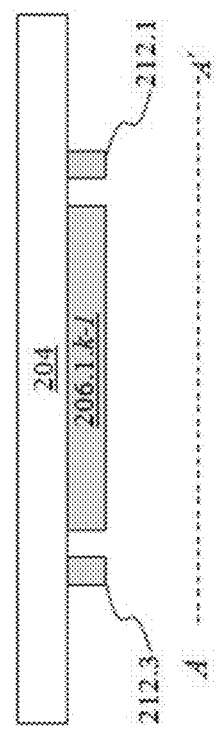
FIG. 2A
FIG. 2B

PCAP WITH ENHANCED IMMUNITY TO WATER CONTAMINANTS

CROSS-REFERENCE TO RELATED APPLICATIONS

This application claims the benefit of U.S. Provisional Application No. 62/508,549, titled PCAP with Enhanced Immunity to Water Contaminants, filed May 19, 2017, which is incorporated herein by reference in its entirety.

BACKGROUND

Field

The present disclosure relates generally to touch sensitive systems, and more specifically to touch sensitive systems in the presence of water contaminants.

Background Art

The ability to interact with computer applications via touch with displays is ubiquitous for today's consumers. While several touch technologies are possible to support touch interactions, each has advantages and disadvantages that tailor each for particular environments, sizes, and applications. Projected capacitive (PCAP) technology is utilized to support characteristics expected from touch interactions in small screen devices such as handheld devices, e.g., smartphones, tablets, etc. Translating those characteristics for use with larger screens and applications faces challenges.

PCAP (projected capacitive) electronics may read out a PCAP touchscreen in either of two distinct modes. One readout mode is referred to as "mutual-capacitive" readout mode, "mutual-capacitance" readout, or more simply "mutual-mode". The other mode is referred to as "self-capacitive" readout mode, "self-capacitance" readout, or more simply "self-mode". The innovations described later in these notes are best appreciated with a clear understanding of the distinction between, and the relative strengths and weakness of, mutual-mode and self-mode of PCAP touchscreen electronic readout.

The mutual mode is known to provide outstanding multi-touch performance. Mobile devices such as smartphones and tablets typically use PCAP touchscreens operated in mutual-mode. Such mobile-device touch systems can typically track simultaneously ten or more touches with little difficulty. However, for PCAP touchscreens with electronic readout in mutual-mode, touch performance degrades rapidly with increasing presence of water contaminants on the touch surface.

The self-mode does not support multi-touch performance at the same level as mutual mode. On the other hand, compared to mutual-mode, self-mode is much less affected by water contaminants on the touch surface. Self-mode is preferred for applications subject to water contamination. This is particularly true for applications that do not require simultaneous detection of multiple touches, such as applications only involving menu selection via single-touch activation of touch buttons.

SUMMARY

System, method, and computer program product embodiments, and combinations and sub-combinations thereof, are provided that support a touch interaction on a projective capacitive (PCAP) display system in the presence of water contamination. According to an embodiment, a system includes a touchscreen coupled to a controller. The controller determines the presence of water contamination on the touchscreen, and obtains measurements during a mixed-mode measurement frame that includes a self-mode measurement and a mutual-mode measurement. Based on the measurements obtained, the controller determines a touch on the touchscreen in the presence of the water contamination on the touchscreen. In some embodiments, the self-mode measurement may include measurements collected at both a lower and a higher drive frequency, the higher drive frequency may be in the frequency range of 100 kHz to 500 kHz. In another embodiment, the self-mode measurement includes simultaneously measuring both horizontal-electrodes and vertical-electrodes.

Water is a troublesome contaminant for PCAP touchscreens that sense touches through electric field effects. The conductivity of water, as well as its very high relative dielectric constant of about 80, perturbs electric fields and hence can compromise PCAP touchscreen signals. The terms "water" or "water contaminant" used throughout the disclosure may refer to any conductive (or high dielectric constant) liquid that can find its way to the surface of a PCAP touchscreen. This includes various types of water such as tap water, rain water and sea water, as well as liquids for which water is a major component such as a beverage, cleaning fluids, body fluids such as blood, most foods, slurries used in a manufacturing process, etc. While uncommon in most applications, it is to be understood that terms "water" or "water contaminant" can even be substituted for conducting liquids that contain no water, such as mercury. For ease of reading, and to highlight an important contaminant in practice, the terms "water" or "water contaminant" are throughout the disclosure. As will be appreciated by persons skilled in the relevant art(s), at least some of the embodiments described herein are applicable to other liquid contaminates.

Further embodiments, features, and advantages of the present disclosure, as well as the structure and operation of the various embodiments of the present disclosure, are described in detail below with reference to the accompanying drawings.

BRIEF DESCRIPTION OF THE DRAWINGS/FIGURES

The accompanying drawings, which are incorporated herein and form part of the specification, illustrate the present disclosure and, together with the description, further serve to explain the principles of the disclosure and to enable a person skilled in the relevant art(s) to make and use the disclosure.

FIG. 2A and FIG. 2B illustrate an exemplary first electrode pattern that can be used to implement the touchscreen according to an exemplary embodiment of the present disclosure;

Figure 1:
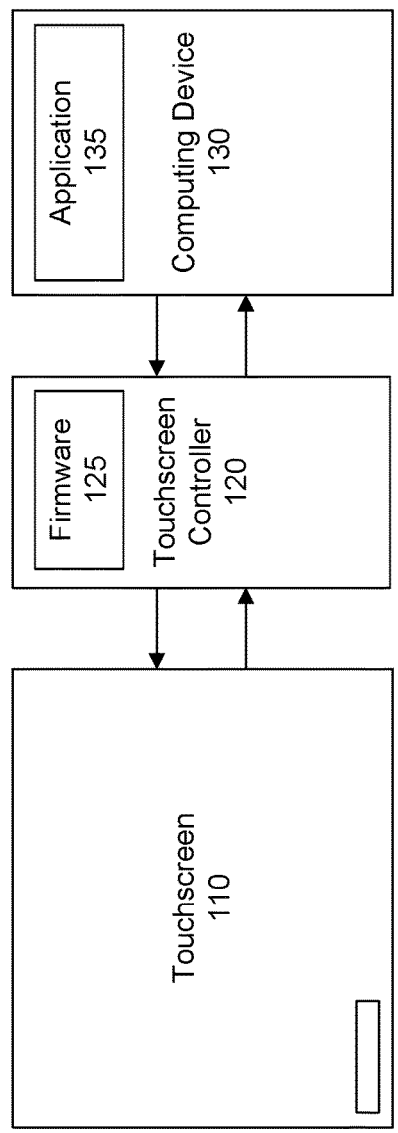
FIG. 1 illustrates a system, according to example embodiments of the disclosure.

The present disclosure will now be described with reference to the accompanying drawings. In the drawings, generally, like reference numbers indicate identical or functionally similar elements. Additionally, generally, the left-most digit(s) of a reference number identifies the drawing in which the reference number first appears.

DETAILED DESCRIPTION

The following Detailed Description of the present disclosure refers to the accompanying drawings that illustrate exemplary embodiments consistent with this disclosure. The exemplary embodiments will fully reveal the general nature of the disclosure that others can, by applying knowledge of those skilled in relevant art(s), readily modify and/or adapt for various applications such exemplary embodiments, without undue experimentation, without departing from the spirit and scope of the disclosure. Therefore, such adaptations and modifications are intended to be within the meaning and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein. Therefore, the detailed description is not meant to limit the present disclosure.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

U.S. patent application Ser. No. 15/214,196, entitled Projected-Capacitive (PCAP) Touchscreen filed on Jul. 19, 2016, and U.S. patent application Ser. No. 14/871,496, entitled Supporting Multiple Users on a Large Scale Projected Capacitive Touchscreen ('496 application) filed on Sep. 30, 2015, both of which are herein incorporated by reference in their entireties, describe example PCAP touchscreen systems.

FIG. 1 illustrates system 100 according to example embodiments of the disclosure. System 100 includes touchscreen 110, touchscreen controller 120, and computing device 130. In embodiments, touchscreen 110 may be a projected capacitive (PCAP) touchscreen used as an interactive surface. System 100 may be a home entertainment system, an industrial control system, a commercial communication and collaboration device, a point of sale system, a kiosk system in retail and tourist settings, a video gaming device, an automatic teller machine (ATM), or any other commercial electronic device having a touchscreen. The teachings herein may also be applicable to a consumer electronic device, e.g., an all-in-one computer, a tablet computer, a smartphone, a personal digital assistant (PDA), a satellite navigation device, a video gaming device, an internet connected appliance, or any other consumer electronic device.

Touchscreen 110 is typically situated in front of a graphical display (such as a monitor—not shown). The graphical display operates as an output device to provide one or more images and/or video relating to application 135 being executed by computing device 130. In some situations, the operator of the touchscreen 110 can touch various areas of touchscreen 110 that correspond to various areas of the graphical display. Herein, a touch refers to physical contact between the touchscreen 110 and the operator or the operator being sufficiently proximate to, with no physical contact with, the touchscreen 110 to disrupt local electrostatic fields within the touchscreen 110. The touchscreen 110 detects a presence and/or a location of the touch and can interpret the presence and/or the location of the touch as one or more commands and/or data from the operator. Computing device 130 may be a host computer running software application 135 (e.g., application-level software), such as a gaming application. Software application 135 may support multiple users that interact with software application 135. Touchscreen controller 120 includes firmware 125 that communicates with software application 135 in computing device 130 via a communication protocol to support the performance characteristics of software application 135.

First Exemplary Touchscreen

FIG. 2A and FIG. 2B illustrate an exemplary first electrode pattern 200 that can be used to implement touchscreen 110 of FIG. 1, according to an exemplary embodiment of the present disclosure. Electrode pattern 200 includes vertical electrodes 202.1 through 202.$k$, configured and arranged in series of k columns, and a plurality of adjacent floating transparent conductive islands disposed on a transparent substrate 204. The transparent substrate 204 represents one or more optically transparent materials. The one or more non-conductive, optically transparent materials can be flexible or inflexible. In an exemplary embodiment, the transparent substrate 204 is implemented using a plate of glass.

The vertical electrodes 202.1 through 202.$k$ are oriented in a vertical direction, such as parallel to the y-axis of the Cartesian coordinate system and perpendicular to the x-axis of the Cartesian coordinate system. In this configuration and arrangement, the vertical electrodes 202.1 through 202.$k$ may be referred to as "X" electrodes due to their role in determining the x coordinates of the touch of the operator when present. However, those skilled in the relevant art(s) will recognize that the other configurations and arrangements for the vertical electrodes 202.1 through 202.$k$ are possible without departing from the spirit and scope of the present disclosure.

As illustrated in FIG. 2A, the vertical electrodes 202.1 through 202.$k$ include electrode pads 206.1.1 through 206.$i.k$ and electrode terminuses 208.1.1 through 208.2.$k$. In an exemplary embodiment, the electrode terminuses 208.1.1 through 208.2.$k$ represent interfaces between the electrode pads 206.1.1 through 206.$i.k$ and associated electronics, such as by using one or more printed silver conductors on the transparent substrate 204 and/or one or more flex cables.

As additionally illustrated in FIG. 2A, the electrode pads 206.1.1 through 206.$i.k$ are configured and arranged in a series of i rows and a series of k columns on the transparent substrate 204. Similarly, the electrode terminuses 208.1.1 through 208.2.$k$ are configured and arranged in a series of two rows and a series of k columns on the transparent substrate 204. Suitable connections between the electrode pads 206.1.1 through 206.$i.k$ to corresponding electrode terminuses 208.1.1 through 208.2.$k$ form a corresponding vertical electrode from among the vertical electrodes 202.1 through 202.$k$. For example, the electrode pads 206.1.1 through 206.$i$.1 within a first column are mechanically and electrically connected to the electrode terminuses 208.1.1 through 208.2.1 from among a first column to form the vertical electrode 202.1. However, those skilled in the relevant art(s) will recognize that other groupings of the electrode pads 206.1.1 through 206.$i.k$ for one or more of the vertical electrodes 202.1 through 202.$k$ are possible without departing from the spirit and scope of the present disclosure.

As shown in FIG. 2A, electrode pads 206.1.1 through 206.$i.k$ can each have one or more floating transparent conductive islands adjacent to it. For example, each of electrode pads 206.1.1 through 206.$i.k$ can have four floating transparent conductive islands 212.1 through 212.$a$ adjacent to it, as illustrated in further detail with respect to electrode pad 206.1.$k$-$l$ located in a portion 210 of electrode pattern 200. Although four floating transparent conductive islands 212.1 through 212.$a$ are illustrated in FIG. 2A, those skilled in the relevant art(s) will recognize that other numbers of transparent conductive islands are possible without departing from the spirit and scope of the present disclosure. In an exemplary embodiment, the electrode pads 206.1.1 through 206.$i.k$ and the plurality of floating transparent conductive islands can be implemented using a suitable transparent conductor, e.g., indium-tin-oxide (ITO). Further, although the electrode pads 206.1.1 through 206.$i.k$ are implemented in a shape of a diamond in FIG. 2A, it should be appreciated that this is illustrative and not restrictive of the shape that can be implemented by those skilled in the relevant art(s).

As the term 'floating' implies, the plurality of floating transparent conductive islands represent shapes of transparent conductive material, which are not electrically connected within the electrodes 202.1 through 202.$k$. In an embodiment, the plurality of floating transparent conductive islands eliminate, or substantially reduce, one or more optical discontinuities that would be otherwise present in touchscreen 110 that includes electrodes 202.1 through 202.$k$.

FIG. 2B illustrates a cross-section of the portion 210 of electrode pattern 200 along the line A-A', and includes a cross-section of the transparent substrate 204, a cross-section of the electrode pad 206.1.$k$-$l$, a cross-section of the floating transparent conductive island 212.1, and a cross-section of the floating transparent conductive island 212.3. In an exemplary embodiment, the transparent substrate 204 is implemented as a plate of glass with an approximate thickness between a fraction of a millimeter to several millimeters, while the electrode pad 206.1.$k$-$l$, the floating transparent conductive island 212.1, and/or the floating transparent conductive islands 212.3 is implemented using a coating of ITO with an approximate thickness less than a wavelength of light. The cross-section of the portion 210 of electrode pattern 200 is to be further described with reference to FIG. 4B and FIG. 4D.

Figures 3A, 3B:
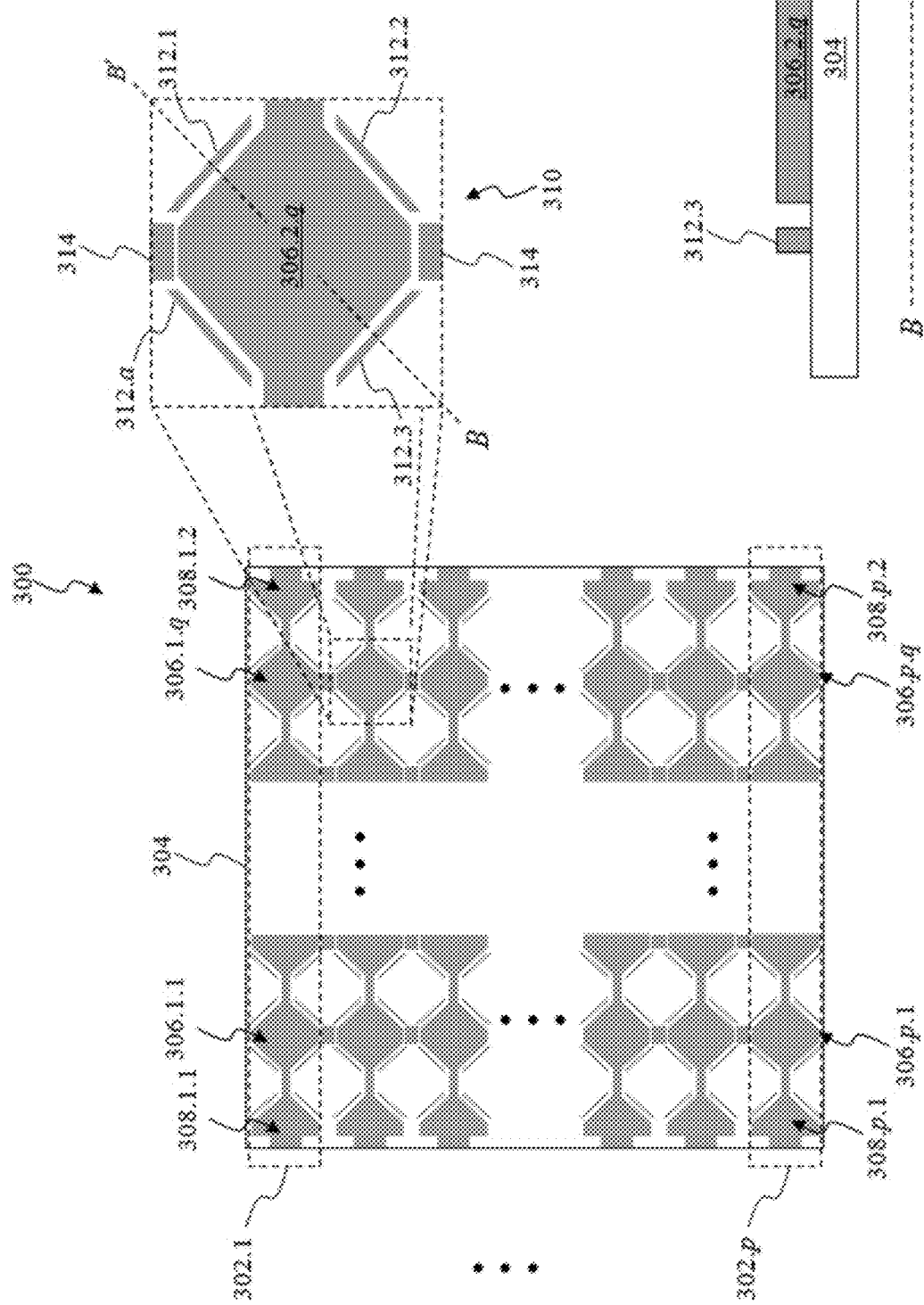
FIG. 3A and FIG. 3B illustrate an exemplary second electrode pattern that can be used to implement the touchscreen according to an exemplary embodiment of the present disclosure.

FIG. 3A and FIG. 3B illustrate an exemplary second electrode pattern 300 that can be used to implement touchscreen 110 according to an exemplary embodiment of the present disclosure. Second electrode pattern 300 includes horizontal electrodes 302.1 through 302.$p$, configured and arranged in a series of p rows, and a plurality of adjacent floating transparent conductive islands disposed on a transparent substrate 304. The transparent substrate 304 is substantially similar to the transparent substrate 204 and will not be discussed in further detail. However, those skilled in the relevant art(s) will recognize that the transparent substrate 304 can be implemented with a different material from the transparent substrate 204 without departing from the spirit and scope of the present disclosure.

In the exemplary embodiment illustrated in FIG. 3A, the horizontal electrodes 302.1 through 302.$p$ are oriented in a horizontal direction, such as perpendicular to the y-axis of the Cartesian coordinate system and parallel to the x-axis of the Cartesian coordinate system. In this configuration and arrangement, the horizontal electrodes 302.1 through 302.$p$ may be referred to as "Y" electrodes due to their role in determining the y coordinates of the touch of the operator when present. However, those skilled in the relevant art(s) will recognize that the other configurations and arrangements for the electrodes 302.1 through 302.$p$ are possible without departing from the spirit and scope of the present disclosure.

As illustrated in FIG. 3A, the horizontal electrodes 302.1 through 302.$p$ include electrode pads 306.1.1 through 306.$p.q$ and electrode terminuses 308.1.1 through 308.$p$.2. In an exemplary embodiment, the electrode terminuses 308.1.1 through 308.$p$.2 represent interfaces between the electrode pads 306.1.1 through 306.$p.q$ and associated electronics, such as by using one or more printed silver conductors on the transparent substrate 304 and/or one or more flex cables.

As additionally illustrated in FIG. 3A, the electrode pads 306.1.1 through 306.$p.q$ are configured and arranged in a series of p rows and a series of q columns on the transparent substrate 304. Similarly, the electrode terminuses 308.1.1 through 308.$p$.2 are configured and arranged in a series of p rows and a series of two columns on the transparent substrate 304. Suitable connections between the electrode pads and corresponding electrode terminuses form a corresponding horizontal electrode. For example, the electrode pads 306.1.1 through 306.1.$q$ are mechanically and electrically connected to the electrode terminuses 308.1.1 through 308.1.2 to form the horizontal electrode 302.1. However, those skilled in the relevant art(s) will recognize that other groupings of the electrode pads 306.1.1 through 306.*p*.*q* for one or more of the horizontal electrodes 302.1 through 302.*p* are possible without departing from the spirit and scope of the present disclosure.

As shown in FIG. 3A, electrode pads 306.1.1 through 306.*p*.*q*, can each have one or more floating transparent conductive islands adjacent to it. For example, each of electrode pads 306.1.1 through 306.*p*.*q* can have floating transparent conductive islands 312.1 through 312.*a* and floating transparent conductive islands 314 adjacent to it, as illustrated in further detail with respect to electrode pad 306.2.*q* located in a portion 310 of electrode pattern 300. In an embodiment, the electrode pads 306.1.1 through 306.*p*.*q* and the plurality of floating transparent conductive islands of electrode pattern 300 are substantially similar to the electrode pads 206.1.1 through 206.*i*.*k* and the plurality of floating transparent conductive islands of electrode pattern 200, respectively; therefore, only differences are discussed in further detail herein.

FIG. 3B illustrates a cross-section of the portion 310 of electrode pattern 300 along the line B-B', which includes a cross-section of the transparent substrate 304, a cross-section of the electrode pad 306.2.*q*, a cross-section of the floating transparent conductive island 312.1, and a cross-section of the floating transparent conductive island 312.3. The cross-section of the portion 310 of electrode pattern 300 is to be further described with reference to FIG. 4B and FIG. 4D.

Figure 4A:
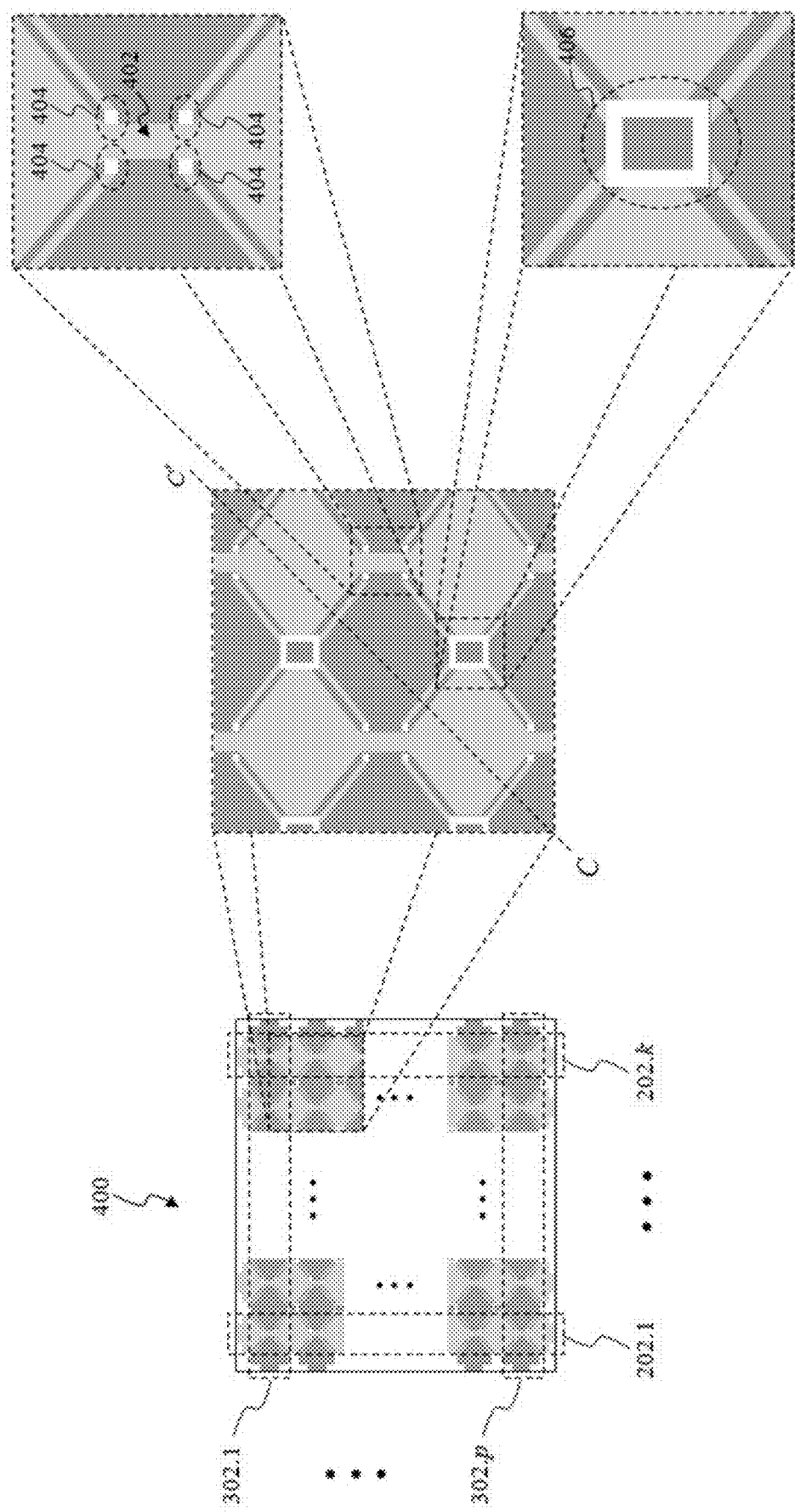
FIG. 4A illustrates a first exemplary touchscreen according to an exemplary embodiment of the present disclosure.

FIG. 4A illustrates a first exemplary touchscreen 400 according to an exemplary embodiment of the present disclosure. Touchscreen 400 may be the same as touchscreen 110. As illustrated in FIG. 4A, the first electrode pattern 200, illustrated in "light gray," and the second electrode pattern 300, illustrated in "dark gray," are overlaid on top of each other to form the touchscreen 400. In an embodiment, transparent substrates 204 and 304 are attached to each other (with the electrode patterns 200 and 300 facing each other) with an optically clear adhesive (OCA) to form the touchscreen 400. As illustrated in FIG. 4A, the vertical electrodes 202.1 through 202.*k* are placed side-by-side in a horizontal direction where each successive vertical electrode 202.1 to 202.*k* has an increasing x coordinate in a Cartesian coordinate system to provide an example. Similarly, the horizontal electrodes 302.1 through 302.*p* are placed one-above-the-other in a vertical direction where each successive horizontal electrode 302.1 to 302.*q* has an increasing y coordinate in a Cartesian coordinate system to provide an example, to form the touchscreen 400. In an exemplary embodiment, the touchscreen 400 represents a projected capacitive (PCAP) touchscreen.

FIG. 4A additionally illustrates a portion of the touchscreen 400 in further detail. As discussed above, the touchscreen 400 is formed by overlaying electrode patterns 200 and 300 on top of each other. Ideally, when electrode patterns 200 and 300 are overlaid on top of each other, a single layer of transparent conductive material can be perceived by the human eye when viewing the touchscreen 400. However, in some situations, one or more optical discontinuities may be present in the touchscreen 400.

As illustrated in FIG. 4A, one or more first regions 402 represent one or more first optical discontinuities having two or more layers of transparent conductive material formed by the overlaying of electrode patterns 200 and 300. For example, the one or more first regions 402 result from connections among columns of the electrode pads 206.1.1 through 206.*i*.*k* (of electrode pattern 200) overlaying corresponding connections among rows of the electrode pads 306.1.1 through 306.*p*.*q* (of electrode pattern 300).

As further illustrated in FIG. 4A, one or more second regions 404 and 406, illustrated in "white" in FIG. 4A, represent one or more second optical discontinuities having no layers of transparent conductive material formed by the overlaying of electrode patterns 200 and 300. The one or more second regions 404 represent regions having no layers of transparent conductive material at the ends of the floating transparent conductive islands 212.1 through 212.*a* (of electrode pattern 200) and/or the floating transparent conductive islands 312.1 through 312.*a* (of electrode pattern 300). Similarly, the one or more second regions 406 represent regions having no layers of transparent conductive material between the electrode pads 206.1.1 through 206.*i*.*k* and the electrode pads 306.1.1 through 306.*p*.*q* and associated floating transparent conductive islands.

Operation of the First Exemplary Touchscreen

Figure 7A:
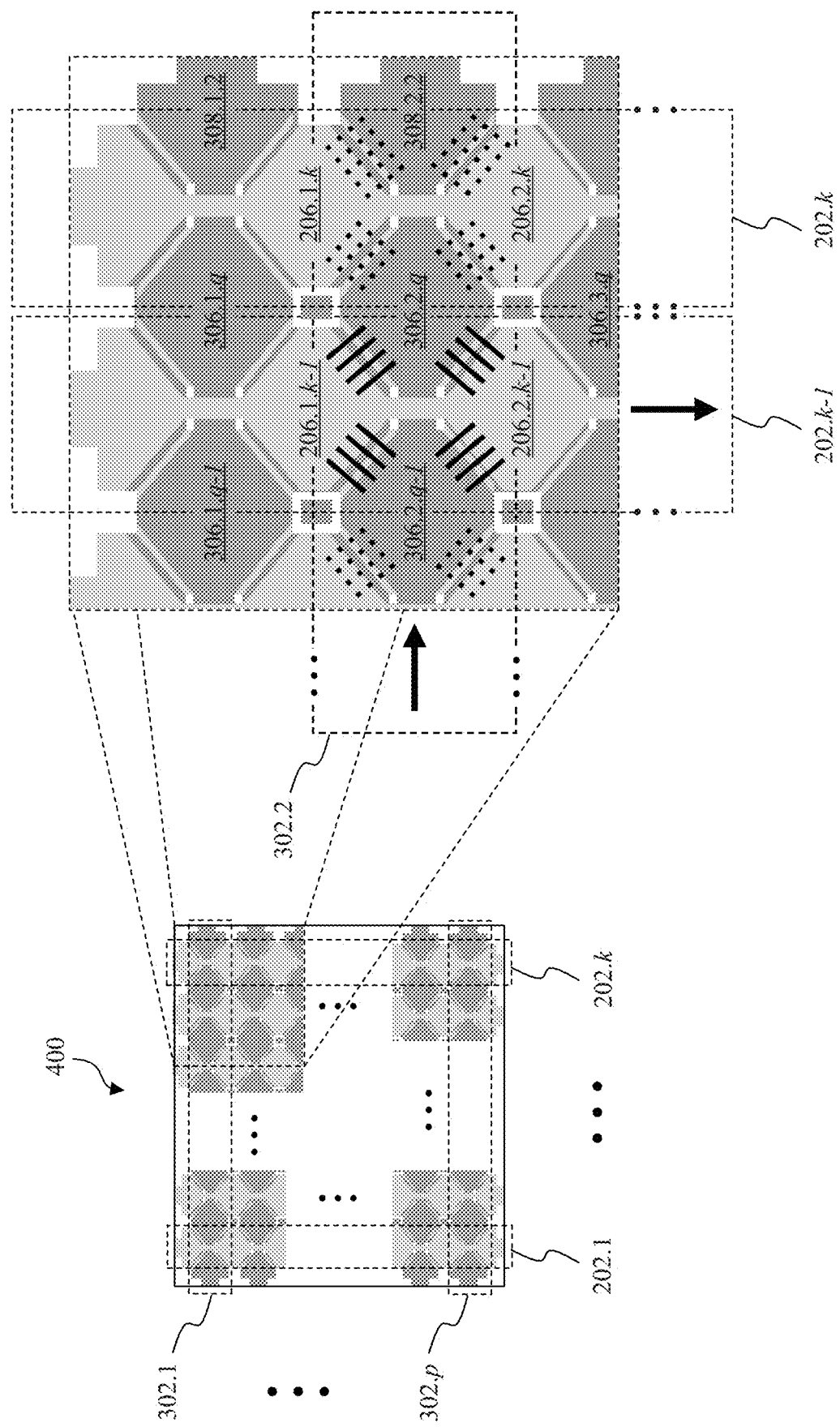
FIGS. 7A and 7B illustrate operation of the first exemplary touchscreen according to an exemplary embodiment of the present disclosure.
Figure 7B:
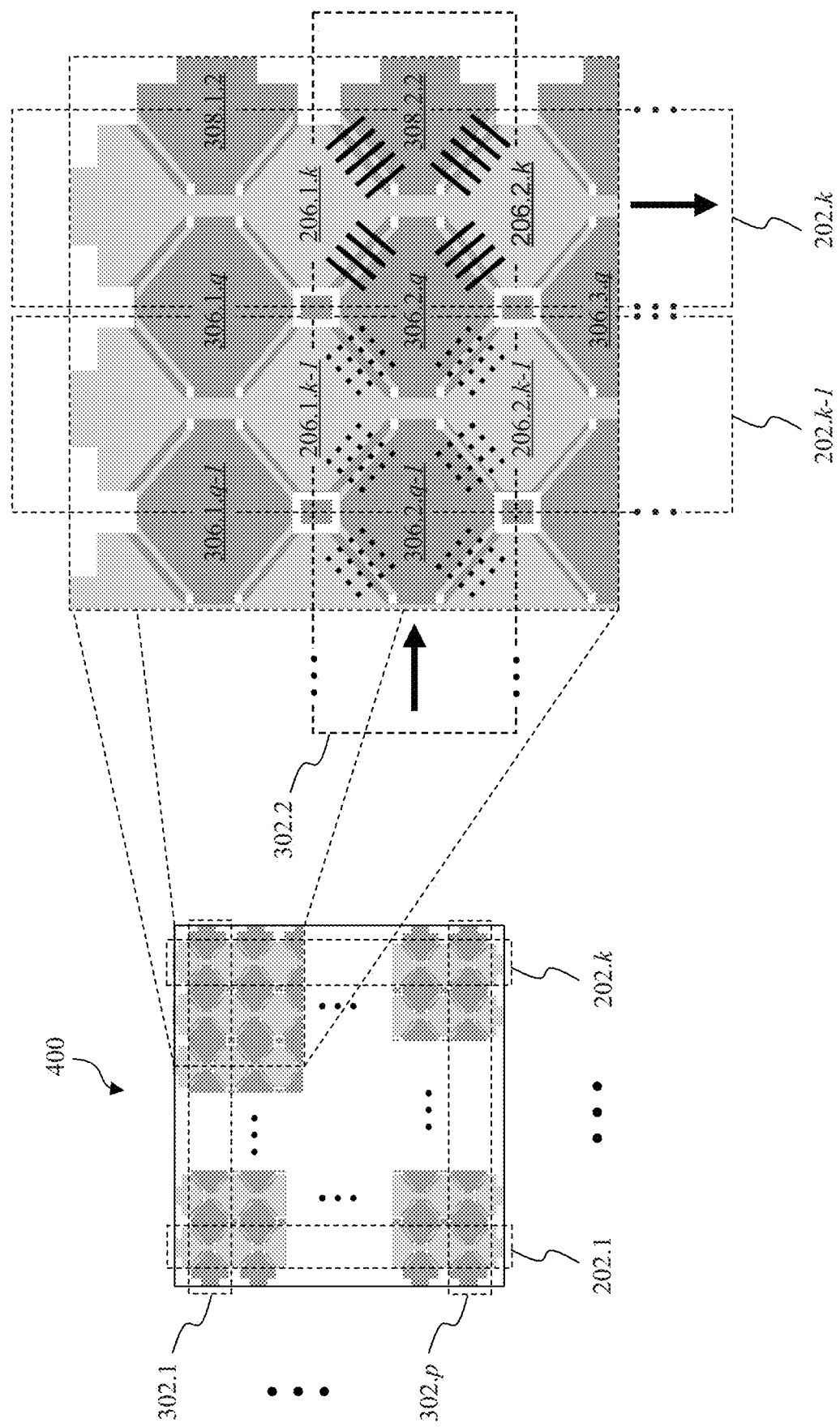

FIGS. 7A and 7B illustrate operation of the first exemplary touchscreen according to an exemplary embodiment of the present disclosure. As discussed above in FIG. 4A, the first electrode pattern 200, illustrated in "light gray," and the second electrode pattern 300, illustrated in "dark gray," are attached to form the touchscreen 400.

The touchscreen 400 can operate in a row scanning mode of operation or in a column scanning mode of operation. In the row scanning mode of operation, one or more horizontal electrodes from among the horizontal electrodes 302.1 through 302.*p* are sequentially excited by a drive signal. The drive signal capacitively couples to one or more vertical electrodes from among the vertical electrodes 202.1 through 202.*k*. Transferred electrical charges or currents due to mutual capacitance(s) between the driven horizontal electrode and the one or more vertical electrodes are measured to detect a presence and/or a location of a touch from an operator, such as a finger of the operator, a hand of the operator, and/or other objects available to the operator, such as a stylus to provide an example. Similarly, in the column scanning mode of operation, one or more vertical electrodes from among the vertical electrodes 202.1 through 202.*k* are sequentially excited by a drive signal. The drive signal capacitively couples to one or more horizontal electrodes from among the horizontal electrodes 302.1 through 302.*p*. Transferred electrical charges or currents due to mutual capacitance(s) between the driven vertical electrode and the one or more horizontal electrodes are measured to detect a presence and/or a location of a touch from an operator. The description to follow further describes the operation of the touchscreen 400 in the row scanning mode of operation. Those skilled in the relevant art(s) will recognize that the column scanning mode of operation operates in a similar manner without departing from the spirit and scope of the present disclosure.

During the row scanning mode of operation and as further illustrated in FIGS. 7A and 7B, a horizontal electrode from among the horizontal electrodes 302.1 through 302.*p* is driven by an excitation signal which capacitively couples to all vertical electrodes 202.1 through 202.*k*. Specifically, FIG. 7A illustrates capacitive coupling of the drive signal from horizontal electrode 302.2 and vertical electrode 202.*k-1* while FIG. 7B illustrates capacitive coupling of the drive signal from horizontal electrode 302.2 and vertical electrode 202.*k*. Generally, a mutual capacitance "$C_M$" is associated with each of the horizontal electrodes 302.1 through 302.*p* and a corresponding one of the vertical electrodes 202.1 through 202.*k*. For example, if "r" represents an index for a vertical electrode 202.*r* from among the vertical electrodes 202.1 through 202.k, and if "s" represents an index of a horizontal electrode 302.s from among the horizontal electrodes 302.1 through 302.p, then k·p mutual capacitances are present between the vertical electrodes 202.1 through 202.k and the horizontal electrodes 302.1 through 302.p, which can be denoted as the set of mutual capacitances $C_M(r,s)$ for r=1 to k and s=1 top.

FIGS. 2-7 illustrate only one specific construction and geometry of electrodes of a PCAP touchscreen. The floating islands are purely optional. The electrode material may be ITO, a metal mesh, silver nanowires, an intrinsically conductive polymer, or any other conductive material. The electrode geometry may include diamond shaped pads (as in FIGS. 1-7) or may simply divide the touch area into rectangular strips. The ideas presented below apply to any PCAP touchscreen with X and Y electrodes, that is to any touchscreen construction with a set of vertically oriented electrodes and with a set of horizontally oriented electrodes and associated self and mutual capacitances.

Figure 5:
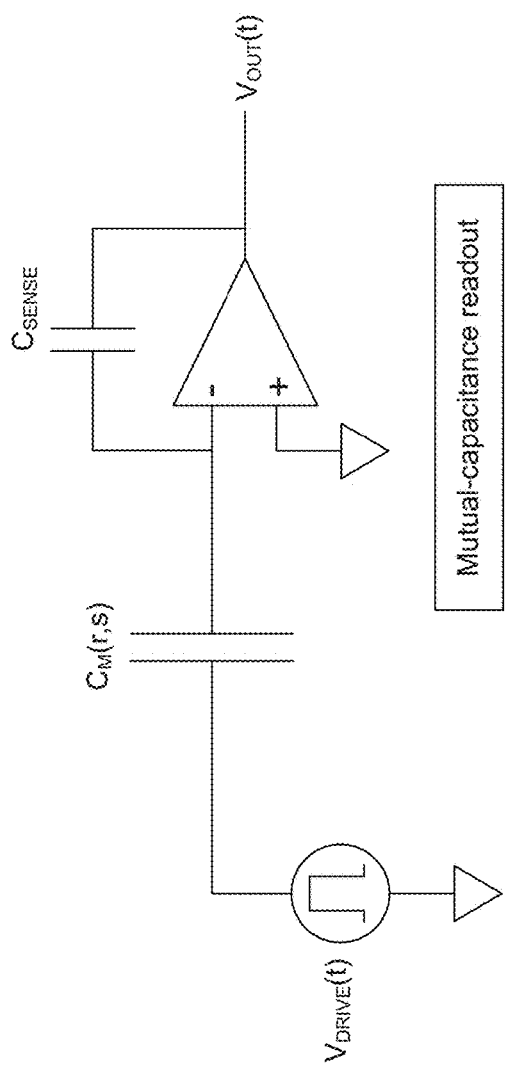
FIG. 5 illustrates a conceptual circuit for mutual-capacitance readout mode, according to example embodiments of the disclosure.

FIG. 5 illustrates a conceptual circuit 500 for mutual-capacitance readout mode, or mutual-mode, according to example embodiments of the disclosure. A signal $V_{DRIVE}(t)$ excites vertical electrode r which couples through mutual capacitance $C_M(r,s)$ to horizontal sense electrode which in turn is connected to a current sensing circuit. The signal output voltage $V_{OUT}(t)$ is proportional to the charge on the integrating capacitor $C_{SENSE}$. Note that the excitation signal is connected to one electrode (electrode r) and the sensing circuit is connected to another electrode (electrode s) and the measured signal is proportional to the mutual capacitance $C_M(r,s)$. A touch reduces the value of $C_M(r,s)$.

The notation $\Delta C_M(r,s)$ represents touch induced changes in the measured mutual capacitance between vertical electrode "r" and horizontal electrode "s" relative to the baseline values $C_M(r,s)$. Water contaminants have the undesired effect of altering the measured touch signals $\Delta C_M(r,s)$.

Figure 6:
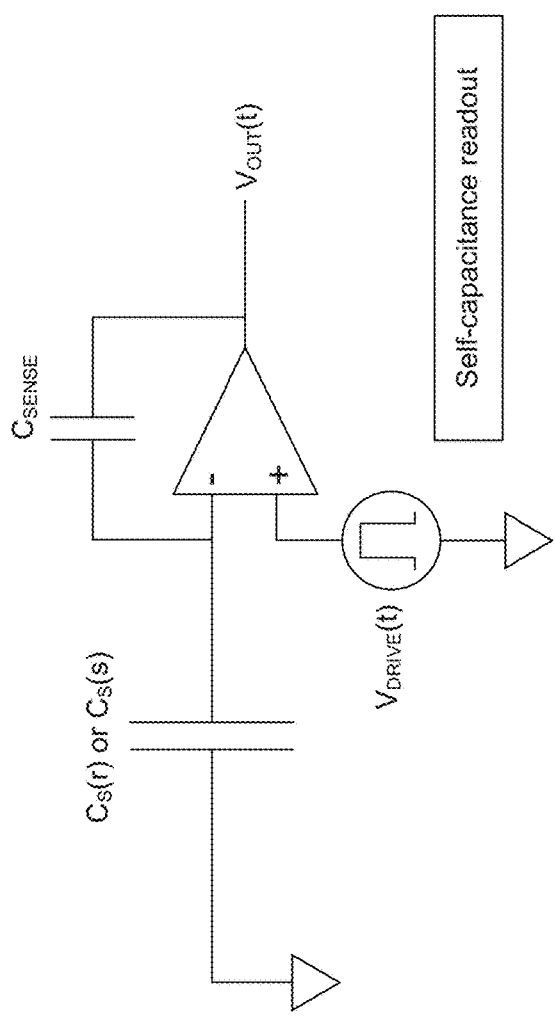
FIG. 6 illustrates a conceptual circuit for self-capacitance readout mode, according to example embodiments of the disclosure.

FIG. 6 illustrates a conceptual circuit 600 for self-capacitance readout mode, or self-mode, according to example embodiments of the disclosure. For self-capacitive readout mode, a capacitance is measured for each electrode, not for electrode pairs. The notation $C^V_S(r)$ represents the no-touch baseline self-capacitance measured for vertical electrode "r". $\Delta C^V_S(r)$ represents the touch induced change in the measured self-capacitance of electrode "r". $C^H_S(s)$ and $\Delta C^H_S(s)$ represent corresponding quantities for horizontal electrode "s". Such a self-capacitance is measured by driving electrode "r" or "s" by an excitation voltage signal and measuring the resulting current or charge provided to the electrode by the driving circuitry. Unlike mutual-capacitance readout mode where one electrode is driven and a separate orthogonal electrode is sensed, in self-capacitance readout mode, an electrode is simultaneously driven and sensed.

A signal $V_{DRIVE}(t)$ at the positive high-gain differential amplifier input is via feedback reproduced at the negative differential amplifier input which in turn drives one electrode (electrode r or electrode s). The ground to the left of the electrode self-capacitance $C_S(r)$ or $C_S(s)$ includes stray capacitances from the electrode to ground as well as the grounding effect of any finger touch. A touch increases the value of $C_S(r)$ or $C_S(s)$. The change on integrating capacitor $C_{SENSE}$ is the same as the charge on $C_S(r)$ or $C_S(s)$, and hence the signal output voltage $V_{OUT}(t)$ is proportional to the charge $C_S(r)$ or $C_S(s)$. Note that in self-mode the excitation signal is delivered to the same electrode (r or s) that is sensed.

Self-mode measurements are made with an excitation signal that transitions between a low voltage and a high voltage, and then back to the low voltage. The corresponding repetition frequency may be referred to as the "self-mode excitation drive frequency" or more briefly the "drive frequency", is conventionally in the range from 10 kHz to 100 kHz.

Figure 8:
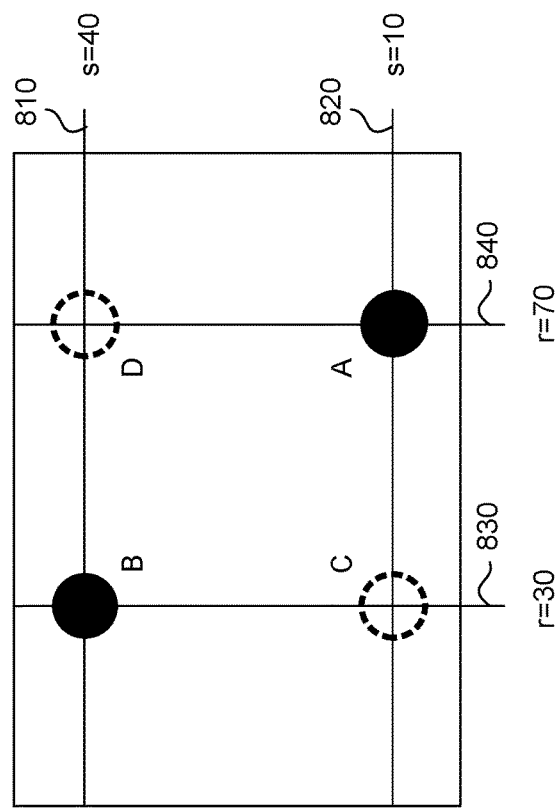
FIG. 8 illustrates an example of mutual-mode advantage for multi-touches, according to example embodiments of the disclosure.

FIG. 8 illustrates an example 800 of mutual-mode advantage for multi-touches, according to example embodiments of the disclosure. As noted above, for a PCAP touchscreen with k vertical electrodes and p horizontal electrodes, there are k*p mutual-capacitance signals $\Delta C_M(r,s)$ measured. In contrast, there are only k+p measured self-capacitance signals $\Delta C^V_S(r)$ and $\Delta C^H_S(s)$. For example, if a PCAP touchscreen has k=100 vertical electrodes and p=50 horizontal electrodes, there will be 5,000 mutual-capacitive signals $\Delta C_M(r,s)$, but much fewer self-capacitive signals. There will be 100 vertical-electrode self-capacitive signals $\Delta C^V_S(r)$ and 50 horizontal-electrode self-capacitive signals $\Delta C^H_S(s)$ for a total of 150 self-capacitive signals. The outstanding multi-touch performance of mutual-mode (when no water contamination is present) relative to self-mode is related to the much larger amount of raw data collected in mutual-mode.

To understand the mutual-mode advantage for multi-touch, consider two simultaneous touches, for example with a touch at the intersection of vertical electrode 840 where r=70 and horizontal electrode 820, where s=10 and another touch at the intersection of vertical electrode 830, where r=30 and horizontal electrode 810, where s=40. These two touch locations correspond to solid circles A and B in the sketch below. In this case controller electronics measures non-zero vertical—electrode self-capacitive signals $\Delta C^V_S$(30) and $\Delta C^V_S$(70) and non-zero horizontal-electrode self-capacitive signals $\Delta C^H_S$(10) and $\Delta C^H_S$(40). From this measured information, it is ambiguous whether there are touches at electrode intersections (r,s)=(30,10) and (r,s)=(70, 40), see dashed circles C and D, or whether the touches are at electrode intersections (r,s)=(70,10) and (r,s)=(30, 40) of the solid circles A and B. That is, it is ambiguous which touched vertical electrode to associate with which touched horizontal electrode. In contrast, mutual-mode does not suffer this ambiguity problem. With non-zero touch signals $\Delta C_M$(70, 10) at solid circle A and $\Delta C_M$(30,40) at solid circle B, and a lack of touch signals $\Delta C_M$(30,10) at dashed circle C and $\Delta C_M$(70,40) at dashed circle D, it is immediately clear that there are touches at electrode intersections (r,s)=(70,10) and (r,s)=(30, 40) corresponding to solid circles A and B and not at electrode intersections (r,s)=(30,10) and (r,s)=(70, 40) corresponding to dashed circles C and D. This advantage of mutual-mode over self-mode becomes increasingly important when there are increasing numbers of simultaneous touches. It is industry practice to use mutual-mode for PCAP touchscreen applications where excellent multi-touch performance is desired and water contamination is not an issue.

Self-mode has an advantage for water immunity over mutual-mode. An untouched drop of water on the surface of a PCAP touchscreen has essentially no effect on the baseline self-capacitive values $C^V_S(r)$ and $C^H_S(s)$, that is, self-capacitive signals $\Delta C^V_S(r)$ and $\Delta C^H_S(s)$ remain essentially zero. Hence in self-mode, a splash of water on the touch surface is unlikely to trigger a false touch report. Furthermore, during a touch, water drops not in contact with a touching finger generate no signals $\Delta C^V_S(r)$ and $\Delta C^H_S(s)$ and hence do not confuse touch recognition algorithms. In self-mode, a finger generates a touch signal because it is electrically grounded to the user's body while an electrically ungrounded water drop remains largely invisible to the electronics.

The situation is different in mutual-mode. Even in the absence of a finger touch, water drops on the touch surface will lead to non-zero values of measured mutual-capacitance signal $\Delta C_M(r,s)$. In mutual-mode, water contamination can lead to false touch reports when none are present. Furthermore, the confounding effects of water induced signals $\Delta C_M(r,s)$ lead to difficulty in detecting and locating valid finger touches. Mutual-mode touch performance degrades to an unacceptable level at a significantly lower level of water contamination than for self-mode.

The above comments about self-mode water immunity apply when well-known guard-electrode techniques are used. This method involves simultaneously exciting all electrodes with the same drive signal. This eliminates the effects of stray capacitance between neighboring electrodes, including effects of changes in stray capacitance between neighboring electrodes due to water drops. This physics of this may be understood from the basic capacitance formula Q=CV by noting that a change in capacitance "C" between neighboring electrodes creates no stray signal change "Q" on either electrode if the voltage difference "V" between the neighboring electrodes is zero.

Just because all electrodes are simultaneously excited does not necessarily mean all self-capacitance signals $\Delta C^V_S(r)$ and $\Delta C^H_S(s)$ are measured simultaneously. It may reduce circuit component count, and hence silicon-chip die size and cost, to break down self-capacitance measurements into sequential blocks. For example, the horizontal-electrode self-capacitance signals $\Delta C^H_S(s)$ might be measured simultaneously after completion of simultaneous measurement of vertical-electrode self-capacitance signals $\Delta C^V_S(r)$. This is a conventional approach to provide a modest cost reduction.

Figure 9:
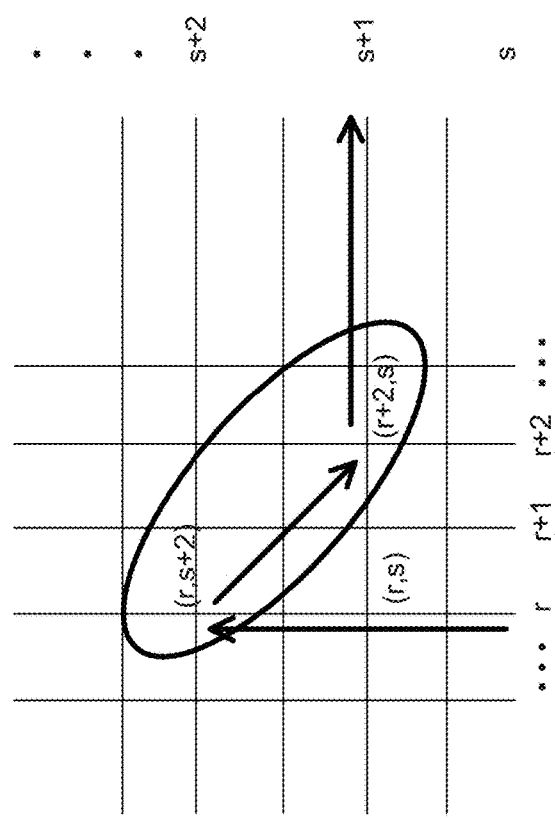
FIG. 9 illustrates mutual-mode ghost effects in a diagram, according to example embodiments of the disclosure.

FIG. 9 illustrates mutual-mode ghost effects in diagram 900, according to example embodiments of the disclosure. Water induced mutual-capacitive signals $\Delta C_M(r,s)$ are not limited to electrode-intersection values (r,s) corresponding to water drop locations. For example consider the effects of a water drop whose area includes electrode-intersections corresponding to values (r, s+2) and (r+2,s), but not (r,s). See sketch below where the ellipse represents a water drop. Not only will the water drop induce non-zero mutual-capacitive signals $\Delta C_M(r,s+2)$ and $\Delta C_M(r+2,s)$, but also will induce a non-zero measured mutual-capacitive signal $\Delta C_M(r,s)$. This is because a drive signal on vertical electrode "r" will via capacitive coupling excite a voltage signal in the water drop which in turn can excite a signal in horizontal electrode "s"; this undesired signal path is indicated in the sketch below by the arrows. The term "ghost" signal may be used to describe such a non-zero mutual-capacitive signal $\Delta C_M(r,s)$ that is measured by the electronics despite the lack of anything physical at the intersection of the "r" and "s" electrodes. In this case, the signal is of opposite algebraic sign than desired touch signals, and hence the more refined term "anti-ghost" may also be used. Such "ghost" or "anti-ghost" signal effects further complication the interpretation of mutual-capacitive signals $\Delta C_M(r,s)$ when water is present.

It may be advantageous to default to mutual-mode under dry conditions and then switch to self-mode when the touch surface is contaminated by water. In this way, the outstanding multi-touch performance of mutual-mode can be provided under normal conditions but at least basic touch operation can be maintained when water contamination is present. Systems may be designed to automatically switch between mutual-mode and self-mode in reaction to the appearance or elimination of water contaminants. Nevertheless there is room to improve the system's ability to make wise decisions about when to switch between the two modes of electronic readout.

Below is a list of some key touch aspects of touch performance. Depending on the application, the requirements and relative importance of these touch performance attributes may vary.

Minimal false touches—When no touch is present, an ideal touch system will issue not false touch reports, even in the presence of water contamination.

Maximal touch detection efficiency—An ideal system will always report a touch when present. In some applications, it is the detection efficiency for single touches that matters. In other applications efficient detection of two or more simultaneous touches may be desired.

Maximal touch coordinate accuracy—An ideal system will accurately report touch coordinates, even in the presence of water contamination.

Reliable gesture recognition—The user's experience is sometimes determined by the system's ability to correctly recognize gestures such as one-finger swipes and two-finger zooms, pinches, pans and rotates.

Wise mutual-mode/self-mode switching—In systems that operate in mutual-mode under dry conditions and in self-mode under wet conditions, best touch performance is provided if switching decisions are made correctly and optimally.

When water contaminants are present, embodiments obtain measurements in both self-mode and mutual-mode in a single measurement frame. Despite the corruption of mutual capacitive measurements $\Delta C_M(r,s)$ by water contaminants, it is still possible to extract useful information from mutual-mode $\Delta C_M(r,s)$ measurements that complement the information in the self-mode measurements $\Delta C^V_S(r)$ and $\Delta C^H_S(s)$.

Figure 10:
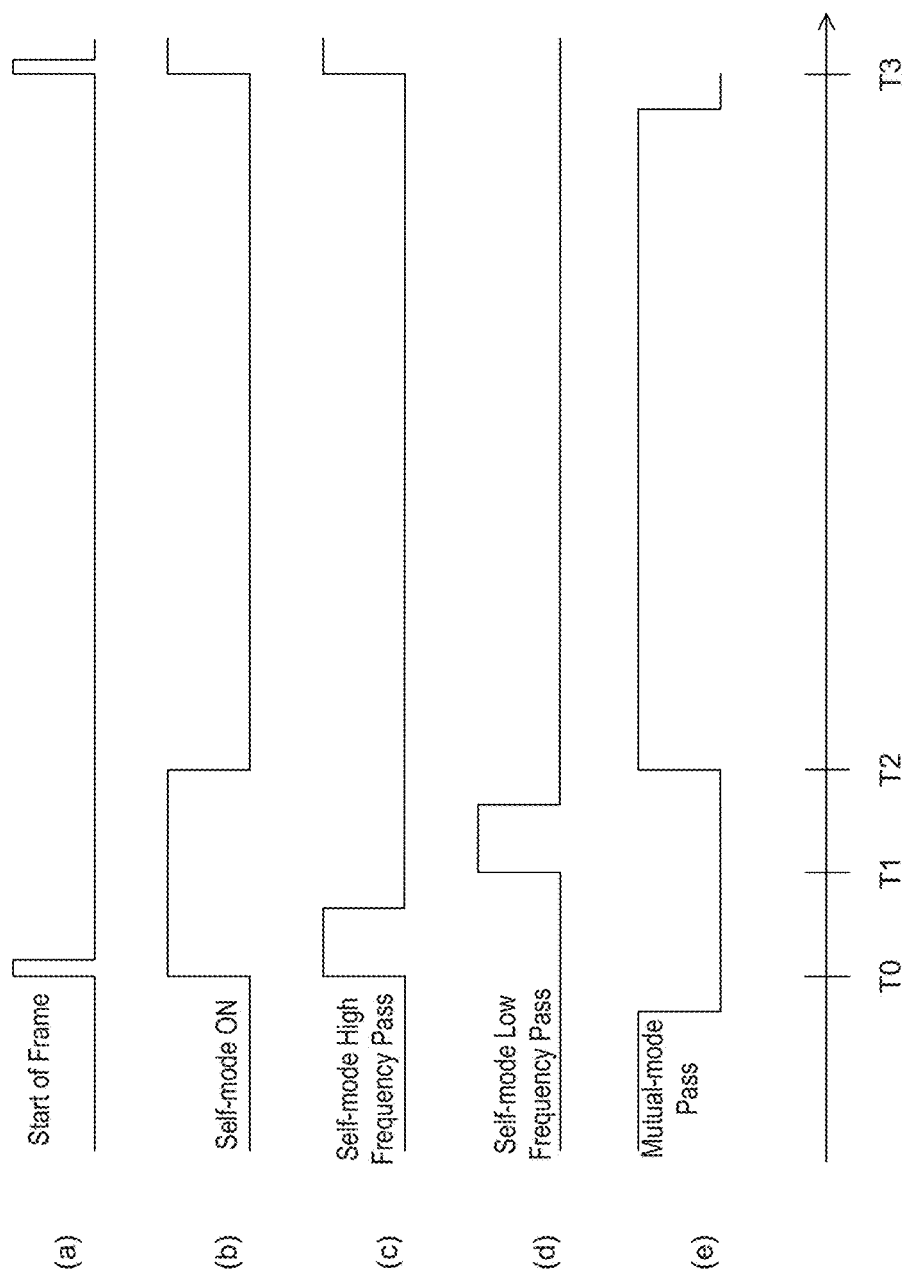
FIG. 10 illustrates a timing diagram of a measurement frame with both self-mode and mutual-mode measurements, according to example embodiments of the disclosure.

FIG. 10 illustrates a timing diagram 1000 of a measurement frame with both self-mode and mutual-mode measurements, according to example embodiments of the disclosure. Referring to signal 10(a), a start-of-frame pulse initiates a measurement frame at time T0. The measurement frame has a duration after which another start-of-frame pulse at time T3 initiates the subsequent frame. To provide what may be perceived as instantaneous touch response, the measurement frame duration T0-T3 is preferably too short to be perceived by humans. For example, the measurement frame duration may be one hundredth of a second (10 milliseconds).

When the logic level of signal 10(b) is true (high), touchscreen controller 120 may configure the electronics for touchscreen 110 to be in self-mode. As illustrated, the electronics for touchscreen 110 are in self-mode from time T0 to time T2, or in this example, about the first quarter of the measurement frame. When the logic level of signal 10(e) is true (high), touchscreen controller 120 may configure the electronics for touchscreen 110 to be in mutual-mode. As illustrated, touchscreen controller 120 may configure the electronics for touchscreen 110 to be in mutual-mode from time T2 to time T3, or the remainder of the measurement frame. As both self-mode and mutual-mode measurements are completed in a measurement frame that is imperceptibly brief to a human, the self-mode and mutual-mode measurements may be regarded as "simultaneous" from a user's perspective.

Such a mixed mode measurement frame is very different than a conventional approach that simply switches from a pure mutual-mode in one measurement frame to a pure self-mode in another measurement frame when water contamination is present. This difference is that in a mixed mode measurement frame, both self-mode and mutual-mode measurements are made within each measurement frame when water is present. Optionally, when in mixed mode measurement frame, touchscreen controller 120 may configure the electronics for touchscreen 110 to revert to pure mutual-mode once touchscreen controller 120 determines that touchscreen 110 is dry to improve mutual-mode performance either by reducing the time between measurement frames or allocating more time to mutual-mode for improved signal averaging.

Some embodiments include determining a presence of a liquid on a touchscreen, using a mixed-mode measurement frame to obtain a self-mode measurement and a mutual-mode measurement, and detecting a touch on the touchscreen.

Figure 11:
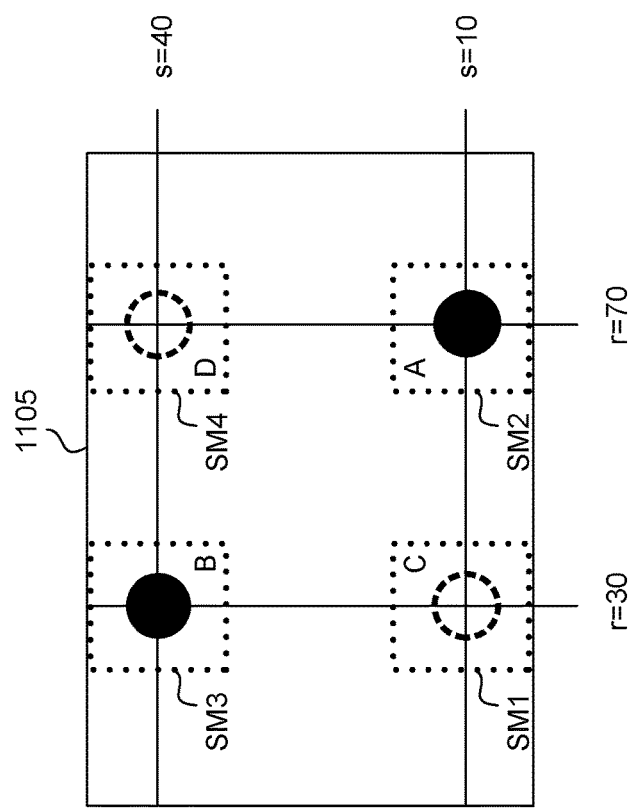
FIG. 11 illustrates a diagram demonstrating that mutual-mode may resolve self-mode ambiguities, according to example embodiments of the disclosure.

FIG. 11 illustrates diagram 1100 demonstrating that mutual-mode may resolve self-mode ambiguities, according to example embodiments of the disclosure. As an example of the utility of touchscreen controller 120 enabling self-mode and mutual-mode measurements in a measurement frame, consider further the ambiguity described above in FIG. 8. Assume touches are centered at the electrode intersections at solid circle A, (r,s)=(70,10) and at solid circle B, (r,s)=(30, 40). Furthermore, let us assume that due to finger size and signal smearing effects of water contaminants, significantly non-zero values are measured for the vertical-electrode self-capacitive signals $\Delta C^V_S(r)$ for r=20, 21, ... 30, ... 39, 40 (due to a second touch) and for r=60, 61, ... 70, ... 79, 80 (due to a first touch). Likewise let us assume significantly non-zero values are measured for the horizontal-electrode self-capacitive signals $\Delta C^H_S(s)$ for s=1, ... 10, ... 19, 20 (due to the first touch) and for s=30, 31, ... 40, ... 49, 50 (due to the second touch). From this self-mode data, a mask may be created to direct data analysis and perhaps even data acquisition for the mutual-mode measurements in the same measurement frame. In particular, mask 1105 may be constructed of four sub-masks SM1-SM4, as follows.

Referring to FIG. 11, lower-left sub-mask SM1 may be defined for the set of electrode intersections (r,s) for which 20≤r≤40 and 0≤s≤20, namely by the intersection of the left set of electrodes with non-zero values $\Delta C^V_S(r)$ with the lower set of electrodes with non-zero values $\Delta C^H_S(s)$. Lower-right, upper-left and upper-right sub-masks SM2, SM3 and SM4 may be defined in a similar fashion. In the example, there are touches within the areas of the lower-right sub-mask SM2 and upper-left sub-mask SM3, and no touches within the area of the lower-left sub-mask SM1 and upper-right sub-mask SM4, but this is not evident from the measurement-frame's self-mode data alone.

If mutual-mode data (e.g., data collected from electrodes of touchscreen 110 while touchscreen 110 is operating in mutual-mode) may be used by touchscreen controller 120 to validate a touch in at least one of the four sub-masks, then the ambiguity is resolved. For example, if mutual-mode measurements provide convincing data that there is indeed a touch in the upper-left sub-mask SM3, then it is clear that the ambiguity is resolved in favor of an upper-left touch B and a lower-right touch A, and not in favor of a lower-left ghost touch C and upper-right touch ghost touch D. This may be the case if much of the touch surface is wet but the touch area corresponding to the upper-left sub-mask SM3 is dry and the mutual-mode data within sub-mask SM3 is uncorrupted by water contamination. This may also be the case when the upper-left sub-mask SM3 area is contaminated with water, it proves impossible to extract accurate touch coordinates from the upper-left mutual-mode data, but it is still possible from upper-left mutual-mode data to determine the existence of a touch. In the latter case, it is only necessary that sufficiently accurate touch coordinates may be determined from the self-mode data. In this fashion, in the presence of water contaminants, data from a measurement frame with both self-mode and mutual-mode measurements combine touch coordinate information from self-mode measurements with the resolution capabilities of mutual-mode measurements to resolve self-mode ambiguities.

In addition, mutual-mode data may be used by touch controller 120 to exclude the possibility of a touch in at least one of the four sub-masks. For example, if mutual-mode data indicate that there is no touch within the area corresponding to the upper-right sub-mask SM4, the ambiguity will be correctly resolved in favor of an upper-left touch B and a lower-right touch A.

For more than two simultaneous touches, similar principles apply but with more complex engineering implementation.

Note that in FIG. 11, the self-mode measurement period from T0 to T2 precedes the mutual-mode measurement period from T2 to T3. This enables use of self-mode data to construct a mask and sub-masks before mutual-mode data is measured and analyzed. This self-mode first measurement order is important if the mask is used to direct mutual-mode data acquisition, such as if the mutual-mode measurements are accelerated by collecting data for electrode intersections only within the masked area.

In some embodiments, the self-mode measurement precedes the mutual-mode measurement. In another embodiment, data from the self-mode measurement are used to identify areas on the touchscreen from which the mutual-mode measurements are collected.

It is conventional to make self-mode measurements using a drive frequency in the 10 kHz to 100 kHz range. Drive frequencies higher than 100 kHz are often avoided to avoid signal amplitude loss resulting from incomplete RC settling of propagating signals within the touchscreen. To improve water immunity on touchscreen 110, some embodiments deviate from convention in two ways: use of two or more drive frequencies and the use of frequencies above the conventional range.

Figure 12:
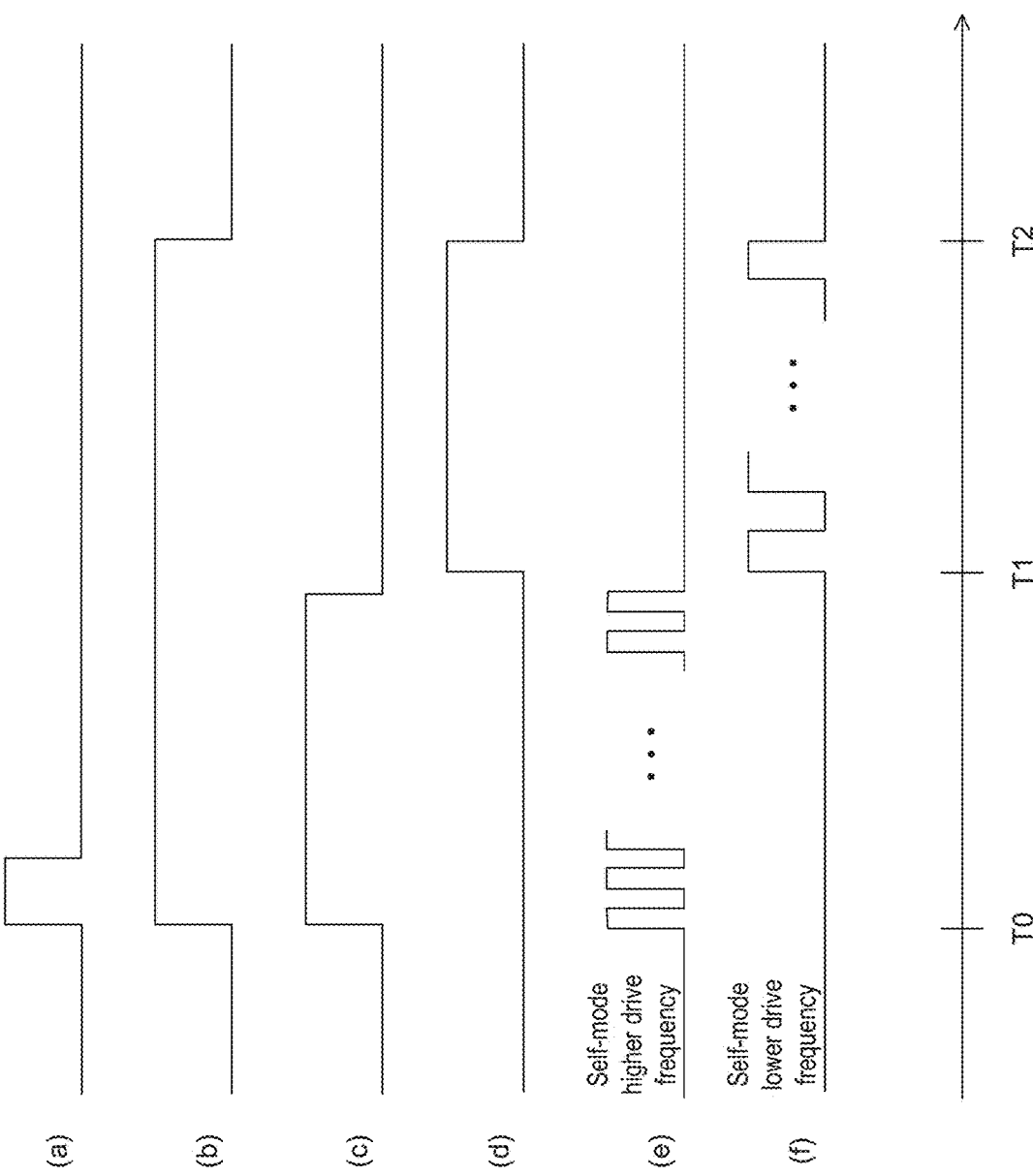
FIG. 12 illustrates a timing diagram of a mixed-mode measurement frame with multiple self-mode drive frequencies, according to example embodiments of the disclosure.

Instead of one set of self-mode measurements $\Delta C^V_S(r)$ and $\Delta C^H_S(s)$ at a given drive frequency, touchscreen controller 120 may collect self-mode measurements twice, once with a lower drive frequency and once with a higher drive frequency. FIG. 12 illustrates a timing diagram 1200 of a mixed-mode measurement frame with multiple self-mode drive frequencies, according to example embodiments of the disclosure. In the timing diagrams of FIGS. 10 and 12, when the logic level of signal (c) is true (high), from time T0-T1, touchscreen controller 120 configures the electronics of touchscreen 110 to be in self-mode with higher drive frequency. When the logic level of signal (d) is true (high), from time T1-T2, touchscreen controller 120 may configure the electronics of touchscreen 110 to be configured in self-mode with a lower drive frequency.

Timing diagram 1200 shows the same signals (a), (b), (c) and (d) as seen in FIG. 10, but on an expanded horizontal time scale. Timing diagram 1200 also illustrates the pulse trains of signals (e) and (f) associated with the self-mode measurements at a higher drive frequency and a lower drive frequency, respectively. Alternatively, the lower frequency self-mode measurement may be performed first.

The lower drive frequency associated with signals (d) and (f) is preferably in a frequency range for which little signal amplitude is lost due to lack of complete RC settling of signal propagating within the sensor. This may correspond to the conventional frequency range from 10 kHz to 100 kHz. This lower drive frequency may be optimized for mutual-mode measurements under dry conditions.

At increased drive frequencies, self-capacitive touch signals tend to be less affected or smeared by water contaminants, even if the self-capacitive touch signals are more affected by incomplete RC settling. The higher drive frequency associated with signal (c) is preferably sufficiently high to provide reduced touch signal smearing. For example, higher drive frequencies in the range from 100 kHz to 500 kHz are of interest. While not optimal for mutual-mode measurements under dry conditions, the high-frequency may be optimized for touch coordinate determinations under wet conditions.

Figure 17:
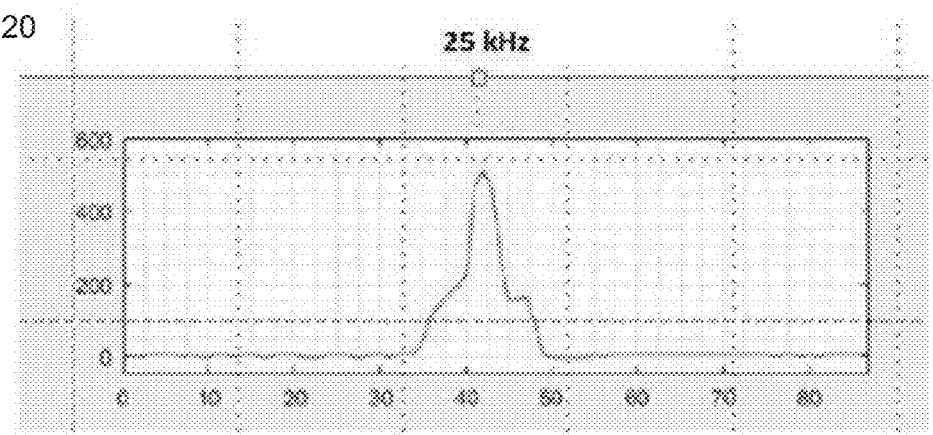
FIG. 17 illustrates self-capacitance touch measurements captured at both a high frequency and a low frequency.
Figure 17:
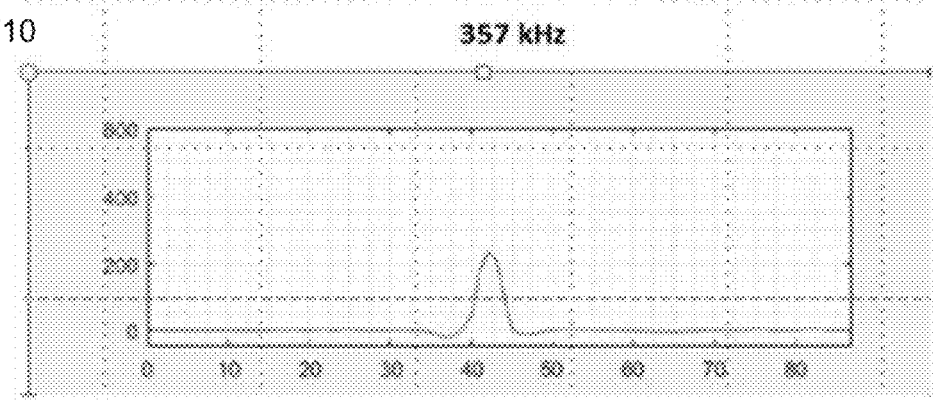

Comparisons of self-mode signals $\Delta C^V_S(r)$ and $\Delta C^H_S(s)$ measured at lower and higher drive frequencies provide additional information about touches and water contamination. The more the signals differ between the two frequencies, the more information is provided by the comparison. FIG. 17 illustrates diagram 1700 with self-capacitance touch measurements captured at both a high frequency and a low frequency. The plot 1710 displays self-capacitances measured at a higher drive frequency of 357 kHz while plot 1720 displays self-capacitances measured at a lower drive frequency of 25 kHz. For both plots the horizontal axis is the vertical electrode index r. The peaks in both plots correspond to the location of a touch. Due to water contamination, the peaks are not clean but rather have tails resulting from touch signals being smeared out by signal propagation through the water. Furthermore, the significant difference in the signal shapes seen in the two plots is a signature of the presence of water contamination. This motivates a selection of higher and lower drive frequencies that significantly differ. Preferably the ratio of the higher drive frequency to the lower drive frequency is large, such as having a higher drive frequency that is five or ten times that of the lower drive frequency.

Defying conventional approaches, a higher drive frequency may be chosen at which significant signal amplitude loss occurs as a result of incomplete RC settling. The disadvantage of reduced signal amplitude, however, may be more than compensated by the benefit of reduced influence of water contaminants on the measured self-mode signals.

Measuring self-mode signals $\Delta C^V_S(r)$ and $\Delta C^H_S(s)$ at a third drive frequency may provide yet further information with which to separate touch and water induced signals. Referring again to FIG. 17, an additional plot of self-capacitance data (not shown) measured at say 100 kHz would provide an intermediate shape between those shown for 357 kHz and 25 kHz and would provide more information on how measured self-capacitance signals vary with frequency. Such additional or redundant data provides algorithms with more information to verify or refine interpretations of signals in terms of desired touch information and distortions due to water. Additional drive frequencies can also be used up to and including an approximation to a frequency sweep of self-mode signals $\Delta C^V_S(r)$ and $\Delta C^H_S(s)$.

In some embodiments, the self-mode measurement comprises data collected at two or more drive frequencies. In an embodiment, a first drive frequency of the two or more drive frequencies is at least five times that of a second drive frequency of the two or more drive frequencies. In an embodiment, the first drive frequency is less than or equal to ten times that of the second drive frequency. In yet another embodiment, the first drive frequency of the two or more drive frequencies is greater than or equal to 100 kHz. In another embodiment, the first drive frequency is less than or equal to 500 kHz.

In some applications, it may be useful to have self-mode signals $\Delta C^V_S(r)$ and $\Delta C^H_S(s)$ at two or more drive frequencies and reduce the time for the mutual-mode measurements within the measurement frame for additional self-mode measurement signal averaging. In some cases, touch controller 120 may transition from a mixed-mode measurement frame to a pure self-mode measurement frame, thus more time is available for self-mode measurement signal averaging.

In some embodiments, a third self-mode measurement is added and the mutual-mode time for the mutual-mode measurement of the mixed-mode measurement frame is reduced accordingly. Some embodiments include transitioning to a pure self-mode measurement frame.

As noted in the background section, in conventional designs chip die size and cost are reduced by breaking down self-capacitance measurements into sequential blocks. For example, the horizontal-electrode self-capacitance signals $\Delta C^H_S(s)$ might be measured simultaneously after completion of simultaneous measurement of vertical-electrode self-capacitance signals $\Delta C^V_S(r)$. However, for applications requiring enhanced water immunity, it may be a bit more costly, but more cost-effective, to simultaneously measure all self-capacitive signals $\Delta C^H_S(s)$ and $\Delta C^V_S(r)$. This is because full simultaneous self-mode readout reduces the readout time by at least a factor of two, thus providing more time to repeat self-mode readout for different drive frequencies.

In some embodiments, to obtain the self-mode measurement, the controller is configured to simultaneously measure horizontal-electrodes and vertical-electrodes.

Figure 13:
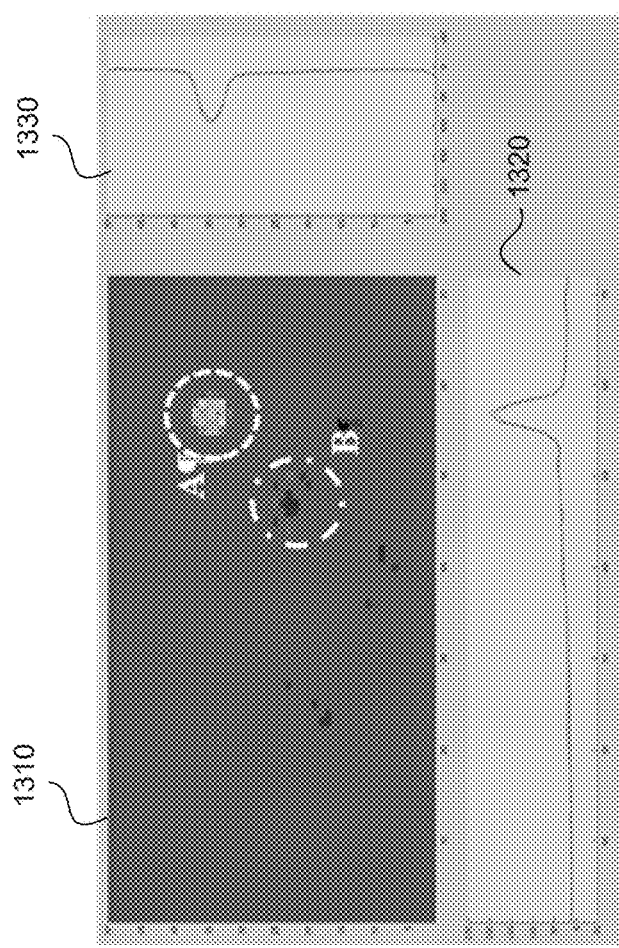
FIG. 13 illustrates a diagram of fluid measurements on a touchscreen based on a mixed mode measurement frame, according to example embodiments of the disclosure.

FIG. 13 illustrates diagram 1300 of fluid measurements on a touchscreen based on a mixed mode measurement frame, according to example embodiments of the disclosure. Compared to conventional approaches, the mixed mode measurement frame operation generates data richer in information about the nature of any water contamination that may be present on touchscreen 110. Precisely because of its greater susceptibility for water contamination, mutual-mode data provides more information about water contaminants on the touchscreen surface. Such information may lead to better algorithms for deciding when to switch between dry and wet modes of operation.

As an example, consider a scenario in which a PCAP system has been operating with a mixed mode measurement frame due to water contamination. Then imagine that the water contamination is removed either by evaporation or by active wiping and cleaning by the user. Particularly before the next touch, it is difficult from self-mode data alone to recognize that the touchscreen is dry, and that a measurement frame of purely mutual-mode measurements is preferred. The more water susceptible mutual-mode data provides much better information than self-mode data on whether the touchscreen surface is wet or dry.

In an example, mutual-mode data $\Delta C_M(r,s)$ and self-mode data $\Delta C^H_S(s)$ and $\Delta C^V_S(r)$ are shown in diagram 1300. The $\Delta C_M(r,s)$ data 1310 is color coded where zero is represented by a neutral gray and negative values by lighter gray (as expected from valid touches), and positive values by darker gray (no valid touches). Data was collected when several drops of water were on a PCAP touchscreen surface (e.g., touchscreen 110). A touch was present in the upper-right water drop labeled "A". The other water drops, such as the one labeled "B" remained electrically isolated from the touched water drop and the touch. Note that in the $\Delta C^H{}_S(s)$ plot 1330 and $\Delta C^V{}_S(r)$ plot 1320, the touched water drop A is clearly seen while untouched water drop B is not. Note also that the touched water drop is dominantly light gray (negative $\Delta C_M(r,s)$) while the untouched water drops generate both negative and positive $\Delta C_M(r,s)$ values. Thus, even if the water drop "A" were not touched, the mutual-mode data $\Delta C_M(r,s)$ would still show a clear signature of water contamination while the self-mode data $\Delta C^H{}_S(s)$ and $\Delta C^V{}_S(r)$ would not.

Some embodiments, the self-mode measurement including measurements from a lower and a higher drive frequency in conjunction with the mutual-mode measurements are used to estimate the level/degree and nature of water contamination as well as locations of water contamination.

Figure 14:
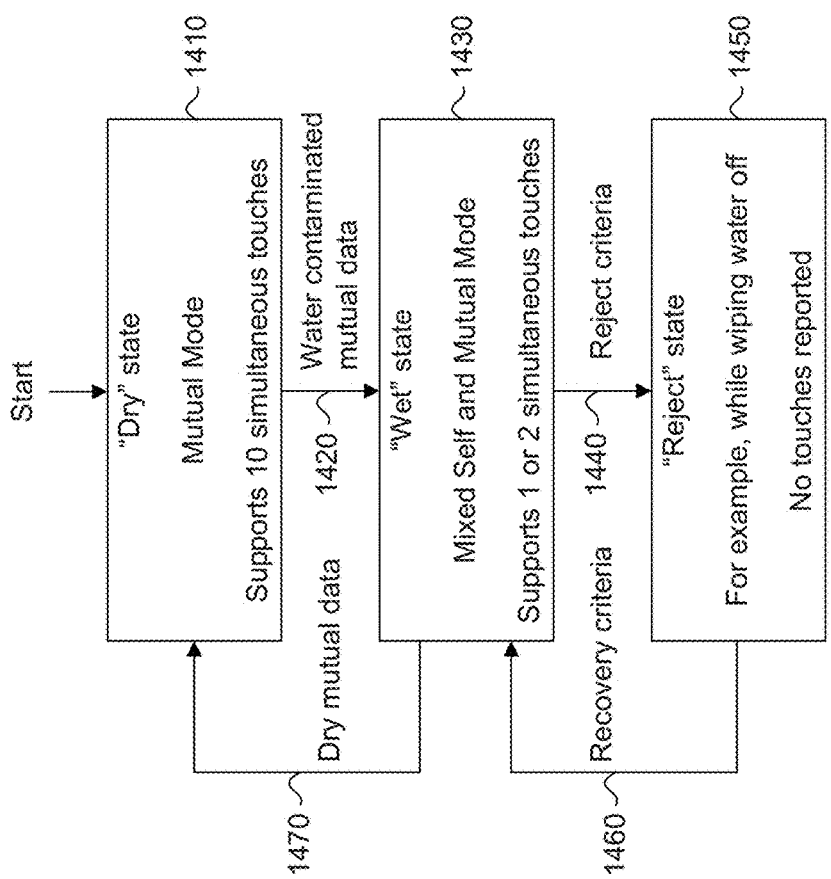
FIG. 14 illustrates a mode state machine, according to example embodiments of the disclosure.

FIG. 14 illustrates a mode state machine 1400, according to example embodiments of the disclosure. State machine 1400 illustrates a mutual-mode "dry" state 1410, a mixed self and mutual "wet" state 1430, and an optional "reject" state 1450.

State machine 1400 is initialized presuming the touchscreen is dry. That is, touchscreen controller 120 initially configures the electronics of touchscreen 110 to begin in "dry" state 1410. The exact nature of "dry" state 1410 may vary depending on the needs of the application. For example, "dry" state 1410 may use pure mutual-mode measurements in a measurement frame, and may support 10 or more simultaneous touches with instantaneous response as perceived by users. At 1420, touchscreen controller 120 may determine (e.g., based on a mixed reading of both positive and negative values mutual mode data as described above) that water contamination is present and transition to "wet" state 1430.

In the wet state 1430, a mixed mode measurement frame is implemented. The exact nature of the wet state may vary depending on the needs of the application. For example, the wet state may use both higher frequency and lower frequency self-modes as well as mutual-mode during each measurement frame. As described above, such a mixed mode measurement frame provides acceptable touch performance for one or two touches even in the presence of water contamination. If mutual mode data, and/or the comparison of a higher-frequency self-mode data and lower-frequency self-mode data, indicate a sufficient level of water contamination, state machine 1400 remains in "wet" state 1430.

At 1470, when the mutual-mode data, and/or the comparison of a higher-frequency self-mode data and lower-frequency self-mode data, indicates that the touchscreen has, or has been, dried off (e.g., touchscreen controller 120 determines that based on the data collected, the water contamination on touchscreen 110 satisfies a threshold value), state-machine 1400 returns from "wet" state 1430 to "dry" state 1410.

"Reject" state 1450, is a state in which no touches are reported and touchscreen 110 is deliberately unresponsive. Such a reject state may be desirable under certain circumstances such as when a user wipes water contaminants off touchscreen 110 with a cloth. During such wiping, the user wants to clean off the touchscreen surface without activating any touch buttons. At 1440, wipe and clean operations may be determined by an initial presence of water as seen in mutual-mode data (and/or the comparison of a higher-frequency self-mode data and lower-frequency self-mode data), as well as large and moving touch areas as seen in self-mode data. Such signatures may be used to define reject criteria that cause the state machine to transition between "wet" state 1430 and "reject" state 1450.

At 1460, touchscreen controller may determine to transition from "reject" state 1450 to "wet" state 1430. The determination may be based on contrasting signatures such as no touches in the self-mode data and reduced water contamination in the mutual-mode data, and/or the passage of a settable amount of time. The latter may be used to define recovery criteria for transitioning from "reject" state 1450 back to "wet" state 1430.

In some embodiments, the controller is configured to determine using the mutual-mode measurement of the mixed-mode measurement frame, that the touchscreen is dry; and transition from the mixed-mode measurement frame to a mutual-mode only measurement frame. In another embodiment, the controller is further configured to detect a reject criterion, and transition from the mixed-mode measurement frame to a reject state.

State machine 1400 is based on data from one measurement frame. More information about a touch and/or water contamination is contained in a time sequence of multiple measurement frames. In other words, multi-frame or inter-frame correlations provide a means to improve touch algorithm performance when water contaminants are present. Such algorithms may be combined with the methods described above.

Figure 15:
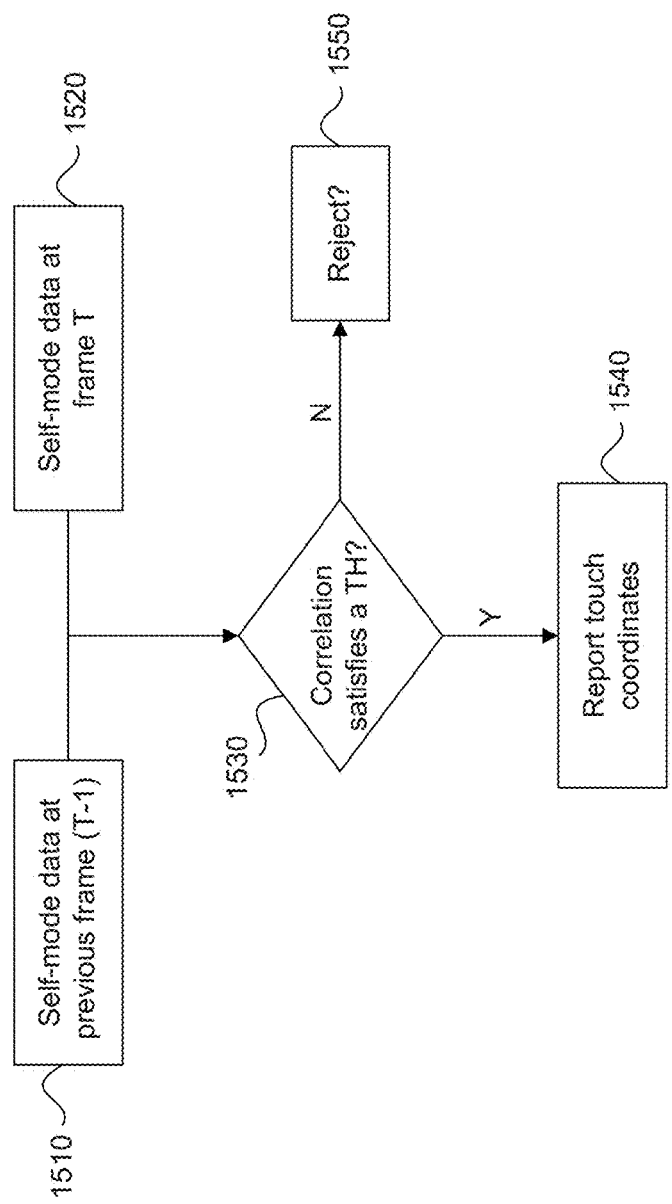
FIG. 15 illustrates a method for a touch algorithm based on multiple self-mode measurement frames, according to example embodiments of the disclosure.

FIG. 15 illustrates a method for a touch algorithm 1500 based on multiple self-mode measurement frames, according to example embodiments of the disclosure. Let "T−1" and "T" refer to two successive frames for which self-mode measurements are collected and saved. At algorithm steps 1510 and 1520, the stored data for frame T−1 and T respectively are made available for processing by algorithm 1500. At algorithm step 1530, patterns of non-zero self-mode signals $\Delta C^V{}_S(r)$ and $\Delta C^H{}_S(s)$ for frame T−1 and frame T are compared and a correlation parameter is computed for each candidate touch. If the correlation parameter for a candidate touch satisfies a settable threshold value (e.g., exceeds a threshold value) then the process moves to step 1540 where touch coordinates are reported. If the correlation parameter does not satisfy the settable threshold value (e.g., is below the threshold value), the candidate touch is rejected in step 1550. Touch algorithm 1500 illustrates the use of data from more than one frame in the detection and locating of touches. One skilled in the art will understand that touch algorithm 1500 can be generalized and refined in many ways such as the use of mixed-mode data from more than one measurement frame, self-mode and/or mixed-mode data from three or more frames, use of various correlation methods, etc. Any such method for combining information between frames may be used with the above described methods in which self-mode data is collected within each frame.

As described above in FIG. 1, PCAP touchscreen 110 is electrically coupled to touchscreen controller 120. Within touchscreen controller 120 is analog circuitry as well as firmware 125 that may control many of the features discussed above. For example, firmware 125 computes touch coordinates that are communicated to application 135 (e.g., software) running on computing device 130 (e.g., a host computer). Application 135 may perform many other functions in addition to receiving touch information. For example, application 135 may determine what images appear on a display behind touchscreen 110. There are scenarios in which communication between firmware 125 and application 135 extend beyond conventional transmission of touch coordinates.

Firmware 125 may quantify water contamination on a touchscreen. Particularly in our fast-self/slow-self/mutual scan schemes described in the '496 application above, the firmware 125 has access to a significant amount of information about the existence, nature and location of water contaminants.

Figure 16:
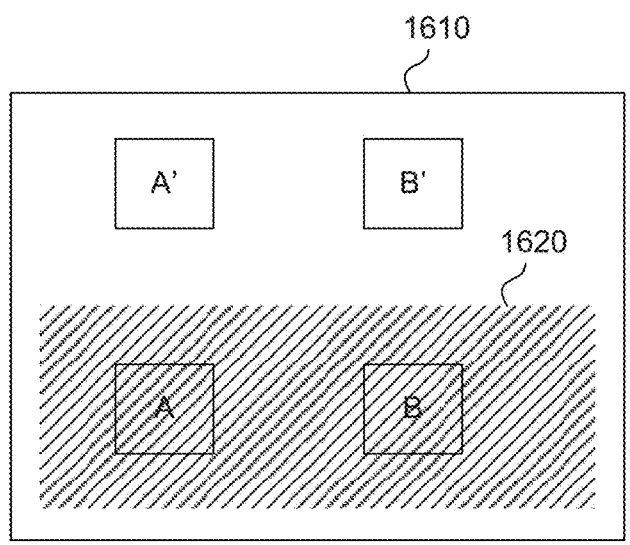
FIG. 16 illustrates an application adjustment diagram based on firmware-level data, according to example embodiments of the disclosure.

FIG. 16 illustrates an application adjustment diagram 1600 based on firmware-level data, according to example embodiments of the disclosure. Application adjustment diagram 1600 includes a touchscreen area 1610 which may be the same as touchscreen 110, and a portion of the touchscreen that has water contamination, area 1620. For example, if before a touch, mutual-mode measurements show much scatter (e.g., positive and negative measurements intermingled as described in FIG. 13) above and below a baseline value (e.g., acceptable threshold value) for area 1620, and at the same time minimal signals are detected in self-mode measurements, firmware 125 may infer that area 1620 is contaminated with water while the upper half of the touchscreen area 1610 remains dry. This is just one example of the type of detailed contaminant information that may be extracted from self-mode and mutual-mode measurements by touchscreen controller 120 and/or firmware 125. A digital communication protocol may be developed for communicating firmware 125-derived information about water contaminates to computing device 130 and/or application 135.

While conventional approaches communicate only touch information from firmware to host-computer application-level code, embodiments include transmitting water contaminant information received solely from the firmware 125, to computing device 130, where computing device 130 takes actions at the system level in response to the received water contaminant information. For example, in application adjustment diagram 1600, area 1620 of the touchscreen 1610 is contaminated with water, application 135 may move critical touch buttons out of the water contaminated area, area 1620 into the dry area of the touchscreen area 1610. Note that critical touch buttons "A" and "B" are moved to new locations "A'" and "B'" in response to water contamination in area 1620. Another possible action is for a message to appear on the display such as "Please wipe water off of screen; touchscreen being deactivated for ten seconds for this purpose." In addition, system 100 may take action to remove the water contamination in response to firmware 125-provided information such as activation of windshield wipers, initiation of a spray of distilled water to wash off more conductive salt water, activation of an air blower, etc.

In some embodiments, the controller transmits mutual-mode and/or self-mode data regarding water contamination to a computing device, wherein the computing device adjusts an application associated with the water contamination. In an embodiment, firmware of the controller transmits the mutual-mode and/or self-mode data to the computing device.

Figure 18:
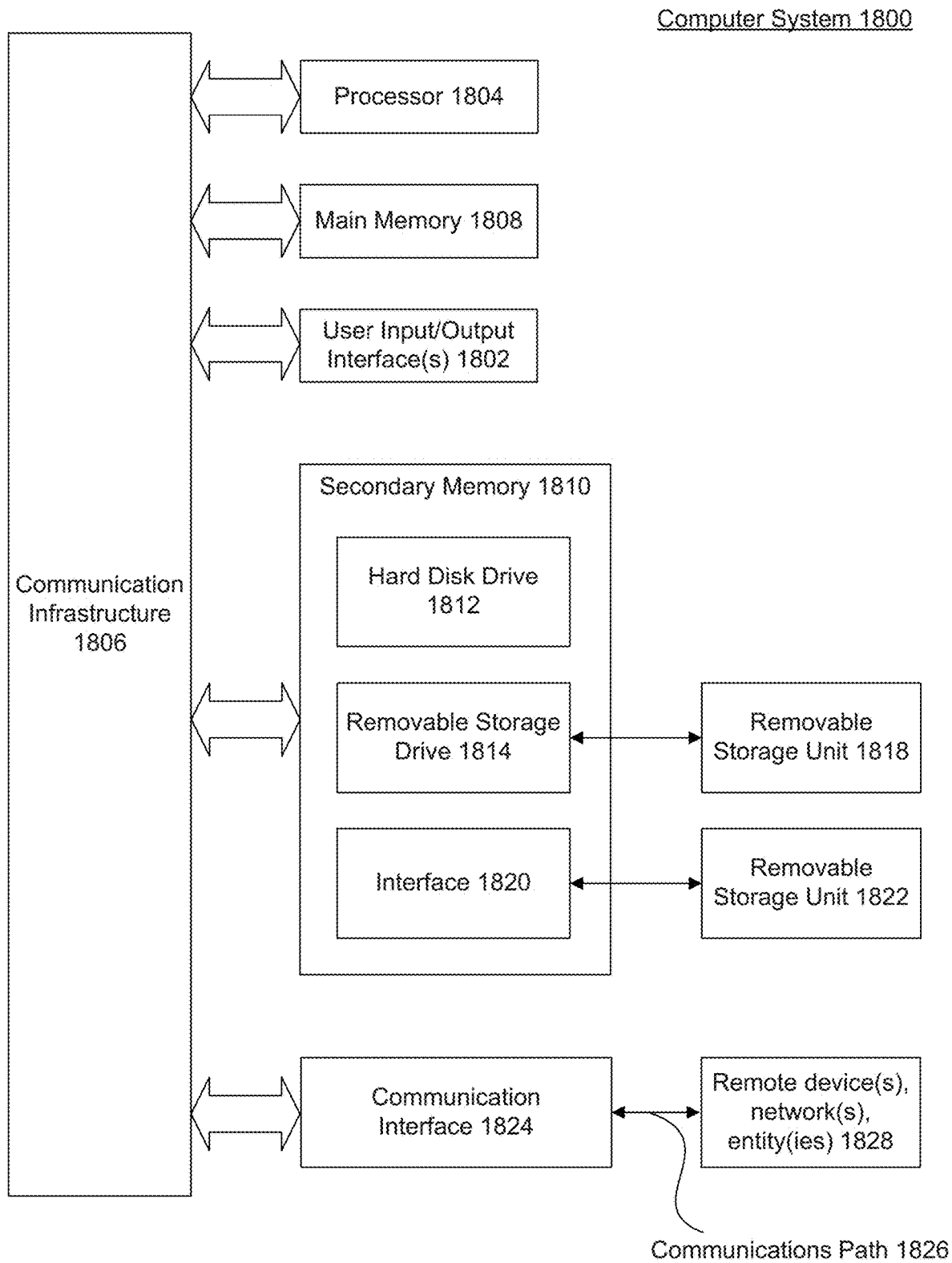
FIG. 18 is an example computer system useful for implementing various embodiments.

Various embodiments can be implemented, for example, using one or more well-known computer systems, such as computer system 1800 shown in FIG. 18. Computer system 1800 can be any well-known computer capable of performing the functions described herein. Computer system 1800 may be internal or external to system 100 as discussed above. Computer system 1800 may perform some or all of the functions of FIGS. 1, and 10-16, for example.

Computer system 1800 includes one or more processors (also called central processing units, or CPUs), such as a processor 1804. Processor 1804 is connected to communication infrastructure 1806 (e.g., a bus.)

One or more processors 1804 may each be a graphics processing unit (GPU). In an embodiment, a GPU is a processor that is a specialized electronic circuit designed to process mathematically intensive applications. The GPU may have a parallel structure that is efficient for parallel processing of large blocks of data, such as mathematically intensive data common to computer graphics applications, images, videos, etc.

Computer system 1800 also includes user input/output interface(s) 1802. Devices such as monitors, keyboards, pointing devices, etc., may communicate with communication infrastructure 1806 through user input/output interface(s) 1802.

Computer system 1800 also includes a main or primary memory 1808, such as random access memory (RAM). Main memory 1808 may include one or more levels of cache. Main memory 1808 has stored therein control logic (i.e., computer software) and/or data.

Computer system 1800 may also include one or more secondary storage devices or memory 1810. Secondary memory 1810 may include, for example, a hard disk drive 1812 and/or a removable storage device or drive 1814. Removable storage drive 1814 may be a floppy disk drive, a magnetic tape drive, a compact disk drive, an optical storage device, tape backup device, and/or any other storage device/drive.

Removable storage drive 1814 may interact with a removable storage unit 1818. Removable storage unit 1818 includes a computer usable or readable storage device having stored thereon computer software (control logic) and/or data. Removable storage unit 1818 may be a floppy disk, magnetic tape, compact disk, DVD, optical storage disk, and/any other computer data storage device. Removable storage drive 414 reads from and/or writes to removable storage unit 1818 in a well-known manner.

According to an exemplary embodiment, secondary memory 1810 may include other means, instrumentalities or other approaches for allowing computer programs and/or other instructions and/or data to be accessed by computer system 1800. Such means, instrumentalities or other approaches may include, for example, a removable storage unit 1822 and an interface 1820. Examples of the removable storage unit 1822 and the interface 1820 may include a program cartridge and cartridge interface (such as that found in video game devices), a removable memory chip (such as an EPROM or PROM) and associated socket, a memory stick and USB port, a memory card and associated memory card slot, and/or any other removable storage unit and associated interface.

Computer system 1800 may further include a communication or network interface 1824. Communication interface 1824 enables computer system 1800 to communicate and interact with any combination of remote devices, remote networks, remote entities, etc. (individually and collectively referenced by reference number 1828). For example, communication interface 1824 may allow computer system 1800 to communicate with remote devices 1828 over communications path 1826, which may be wired and/or wireless, and which may include any combination of LANs, WANs, the Internet, etc. Control logic and/or data may be transmitted to and from computer system 1800 via communication path 1826.

In an embodiment, a tangible, non-transitory apparatus or article of manufacture comprising a tangible, non-transitory computer useable or readable medium having control logic (software) stored thereon is also referred to herein as a computer program product or program storage device. This includes, but is not limited to, computer system 1800, main memory 1808, secondary memory 1810, and removable storage units 1818 and 1822, as well as tangible articles of manufacture embodying any combination of the foregoing. Such control logic, when executed by one or more data processing devices (such as computer system 1800), causes such data processing devices to operate as described herein.

The foregoing description, for purposes of explanation, used specific nomenclature to provide a thorough understanding of the disclosure. However, it will be apparent to one skilled in the art that specific details are not required in order to practice the disclosure. Thus, the foregoing descriptions of specific embodiments of the disclosure are presented for purposes of illustration and description. They are not intended to be exhaustive or to limit the disclosure to the precise forms disclosed; obviously, many modifications and variations are possible in view of the above teachings. The embodiments were chosen and described in order to best explain the principles of the disclosure and its practical applications, they thereby enable others skilled in the art to best utilize the disclosure and various embodiments with various modifications as are suited to the particular use contemplated. It is intended that the following claims and their equivalents define the scope of the disclosure.

Based on the teachings contained in this disclosure, it will be apparent to persons skilled in the relevant art(s) how to make and use embodiments of the disclosure using data processing devices, computer systems and/or computer architectures other than that shown in FIG. 18. In particular, embodiments may operate with software, hardware, and/or operating system implementations other than those described herein.

It is to be appreciated that the Detailed Description section, and not the Abstract section, is intended to be used to interpret the claims. The Abstract section may set forth one or more, but not all exemplary embodiments, of the disclosure, and thus, are not intended to limit the disclosure and the appended claims in any way.

The disclosure has been described above with the aid of functional building blocks illustrating the implementation of specified functions and relationships thereof. The boundaries of these functional building blocks have been arbitrarily defined herein for the convenience of the description. Alternate boundaries may be defined so long as the specified functions and relationships thereof are appropriately performed.

It will be apparent to those skilled in the relevant art(s) that various changes in form and detail can be made therein without departing from the spirit and scope of the disclosure. Thus the disclosure should not be limited by any of the above-described exemplary embodiments. Further, the claims should be defined only in accordance with their recitations and their equivalents.

What is claimed is:

1. A projected capacitive (PCAP) touch system comprising:
    a touchscreen; and
    a controller coupled to the touchscreen, the controller configured to:
        obtain measurements during a mixed-mode measurement frame comprising two self-mode measurements followed by a mutual-mode measurement, wherein the two self-mode measurements comprise a lower drive frequency measurement followed by and a higher drive frequency measurement,
        wherein the two self-mode measurements determine areas on the touchscreen where the mutual-mode measurement is collected; and
        based on the measurements, determine a touch on the touchscreen in a presence of water contamination on the touchscreen.

2. The PCAP touch system of claim 1, wherein a lower drive frequency of the lower drive frequency measurement is in a range from 10 kHz to 100 kHz.

3. The PCAP touch system of claim 1, wherein a higher drive frequency of the higher drive frequency measurement is in a range from 100 kHz to 500 kHz.

4. The PCAP touch system of claim 1, wherein a higher drive frequency of the higher drive frequency measurement is at least five to ten times that of a lower drive frequency of the lower drive frequency measurement.

5. The PCAP touch system of claim 1, wherein the controller is further configured to:
    measure the water contamination, based on the lower drive frequency measurement and the higher drive frequency measurement.

6. The PCAP touch system of claim 5, wherein to measure the water contamination, the controller is configured to:
    determine a quantity of the water contamination; and
    determine a location of the water contamination.

7. The PCAP touch system of claim 1, wherein the self-mode measurement comprises a third drive frequency measurement, wherein a corresponding third drive frequency of the third drive frequency measurement is between a lower drive frequency of the lower drive frequency measurement and a higher drive frequency of the higher drive frequency measurement.

8. The PCAP touch system of claim 1, wherein the controller is further configured to:
    based on the measurements obtained, transition to obtain measurements in: a mutual-mode only measurement frame or a self-mode only measurement frame.

9. The PCAP touch system of 1, wherein the controller is further configured to:
    create a mask comprising a range of vertical electrodes and a range of horizontal electrodes;
    determine a set of electrode intersections corresponding to non-zero values of a self-mode measurement obtained within the two self-mode measurements; and
    apply the mask to electrode intersections of the set of electrode intersections.

10. The PCAP touch system of claim 9, wherein the controller is further configured to:
    identify sub-masked areas of the touchscreen where the mask is applied; and
    collect mutual-mode measurements from the sub-masked areas of the touchscreen.

11. The PCAP touch system of claim 9, wherein for an electrode intersection (r, s) of the set of electrode intersections, the range of vertical electrodes r comprises 20<=r<=40 or the range of horizontal electrodes comprises 0<=s<=20.

12. A method comprising:
    obtaining measurements from a touchscreen during a mixed-mode measurement frame comprising two self-mode measurements followed by a mutual-mode measurement, wherein the two self-mode measurements comprise a lower drive frequency measurement followed by a higher drive frequency measurement,
    wherein the two self-mode measurements determine areas on the touchscreen where the mutual-mode measurement is collected; and based on the measurements, determining a touch on the touchscreen in a presence of water contamination on the touchscreen.

13. The method of claim 12, wherein a lower drive frequency of the lower drive frequency measurement is in a range from 10 kHz to 100 kHz.

14. The method of claim 12, wherein a higher drive frequency of the higher drive frequency measurement is in a range from 100 kHz to 500 kHz.

15. The method of claim 12, wherein a higher drive frequency of the higher drive frequency measurement is at least five to ten times that of a lower drive frequency of the lower drive frequency measurement.

16. The method of claim 12, further comprising measuring the water contamination, based on the lower drive frequency measurement and the higher drive frequency measurement.

17. The method of claim 16, wherein the measuring the water contamination comprises:
  determining a quantity of the water contamination; and
  determining a location of the water contamination.

18. The method of claim 12, wherein the self-mode measurement comprises a third drive frequency measurement, wherein a corresponding third drive frequency of the third drive frequency measurement is between a lower drive frequency of the lower drive frequency measurement and a higher drive frequency of the higher drive frequency measurement.

19. The method of claim 11, further comprising:
  creating a mask comprising a range of vertical electrodes and a range of horizontal electrodes;
  determining a set of electrode intersections corresponding to non-zero values of a self-mode measurement obtained within the two self-mode measurements; and
  applying the mask to electrode intersections of the set of electrode intersections.

20. A non-transitory computer-readable medium storing instructions that, when executed by a processor of a first electronic device, cause the processor to perform operations, the operations comprising:
  obtaining measurements from a touchscreen during a mixed-mode measurement frame comprising: two self-mode measurements followed by a mutual-mode measurement, wherein the two self-mode measurements comprise a lower drive frequency measurement followed by a higher drive frequency measurement,
  wherein the two self-mode measurements determine areas on the touchscreen where the mutual-mode measurement is collected; and
  based on the measurements, determining a touch on the touchscreen in a presence of water contamination on the touchscreen.

* * * * *

UNITED STATES PATENT AND TRADEMARK OFFICE
CERTIFICATE OF CORRECTION

PATENT NO. : 10,901,557 B2
APPLICATION NO. : 15/982124
DATED : January 26, 2021
INVENTOR(S) : Ali et al.

It is certified that error appears in the above-identified patent and that said Letters Patent is hereby corrected as shown below:

In the Specification

In Column 10, Line 27, replace "a touch at the intersection of vertical electrode 840 where" with --a touch at the intersection of vertical electrode 840, where--.

Signed and Sealed this
Twenty-fifth Day of May, 2021

Drew Hirshfeld
*Performing the Functions and Duties of the*
*Under Secretary of Commerce for Intellectual Property and*
*Director of the United States Patent and Trademark Office*